United States Patent [19]

Glover

[11] Patent Number: 4,779,264
[45] Date of Patent: Oct. 18, 1988

[54] MULTIPLEX SYSTEM INCLUDING SHIELDED CABLE

[75] Inventor: Douglas W. Glover, Harrisburg, Pa.

[73] Assignee: AMP Incorporated, Harrisburg, Pa.

[21] Appl. No.: 837,935

[22] Filed: Mar. 10, 1986

[51] Int. Cl.[4] .......................... H04J 3/02; H04M 11/04
[52] U.S. Cl. ...................................... 370/85; 340/310 A
[58] Field of Search ............. 370/85, 100; 340/310 A, 340/310 R; 333/12, 242, 243; 179/170 J; 379/326, 348

[56] References Cited

U.S. PATENT DOCUMENTS

| 3,571,613 | 3/1971 | Plate | 307/147 |
|---|---|---|---|
| 3,691,304 | 9/1972 | Huebner | 179/15 R |
| 3,900,791 | 8/1975 | Kleen | 323/93 |
| 4,538,262 | 8/1985 | Sinniger et al. | 370/85 |
| 4,569,045 | 2/1986 | Schieble et al. | 370/85 |

FOREIGN PATENT DOCUMENTS

| 0008238 | 2/1980 | European Pat. Off. . |
| 0150592 | 8/1985 | European Pat. Off. . |
| 0142050 | 8/1986 | European Pat. Off. . |

OTHER PUBLICATIONS

"Remote Keyboard Interface" by M. D. Alger and B. Benson of Wireless World, vol. 87, No. 1545, Jun. 1981, pp. 77–78, Sheepen Place, Colchester, England.

Primary Examiner—Douglas W. Olms
Assistant Examiner—Frank M. Scutch, III
Attorney, Agent, or Firm—Adrian J. LaRue; Bruce J. Wolstoncroft

[57] ABSTRACT

A multiplex system includes a master controller and a plurality of remote stations which are connected together by a cable. The cable is a twin co-ax cable which includes data and clock conductors which are surrounded by power and ground conductors. The power and ground conductors are capacitively coupled such that the power conductor simultaneously transmits power and provides an effective shield. The master controller includes a microcomputer which in turn includes an UART. The UART is used to transmit command bits to the remote stations while the CPU reads response bits from the remote stations in order to allow response bits to be interleaved in time with command bits. In one embodiment, the command bits are used to strobe row conductors of a keyboard and the response bits are used to monitor column conductors of the keyboard to allow a keyboard to be controlled by the master controller 20 in a simple and efficient manner. In the preferred embodiment an integration counter is used to decode response signals such as those from a keyboard and the integration counter is incremented when the desired signal is obtained and decremented when it is not. In this way the state of the signal can be determined even in an extremely noisy environment.

11 Claims, 12 Drawing Sheets

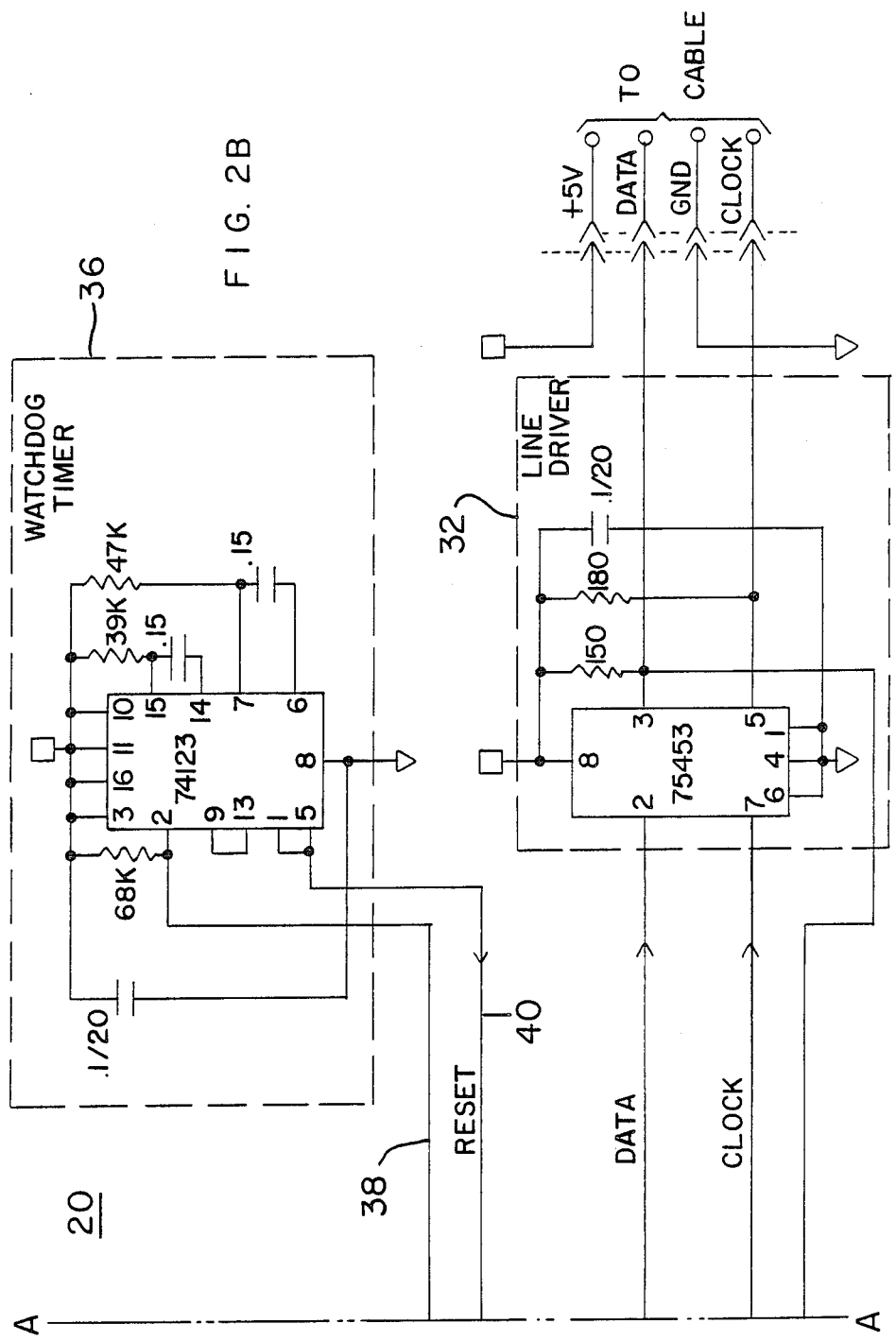

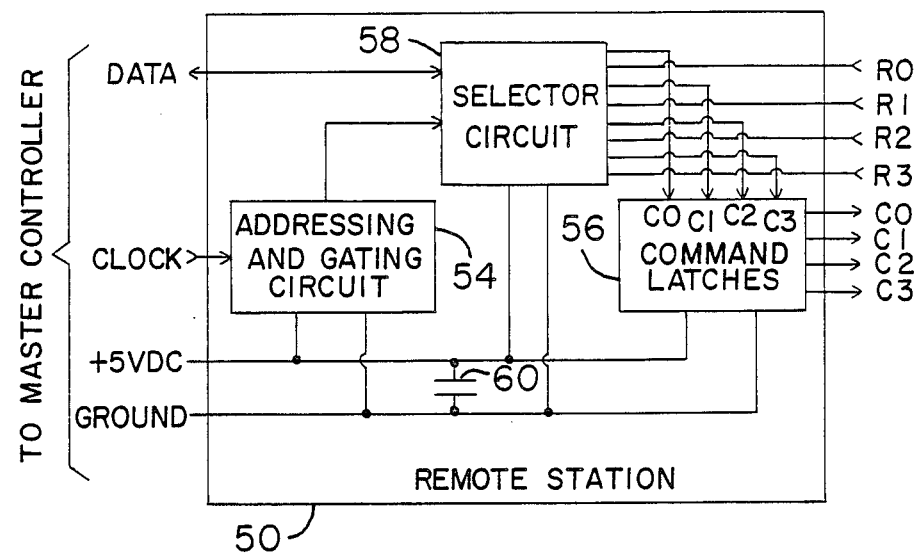
F I G. 4
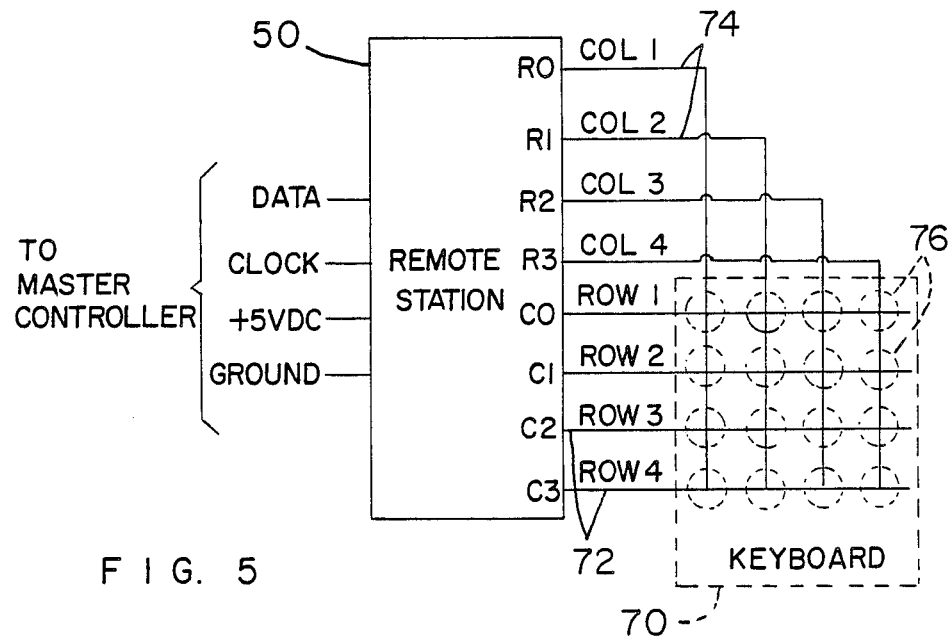
F I G. 5

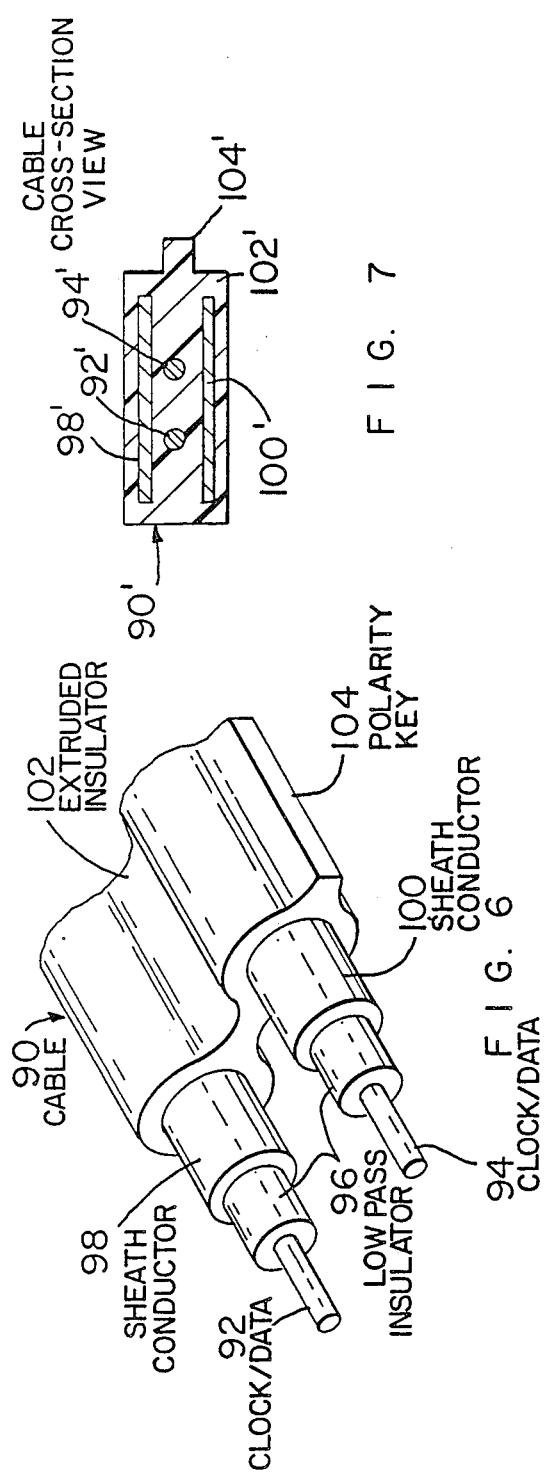

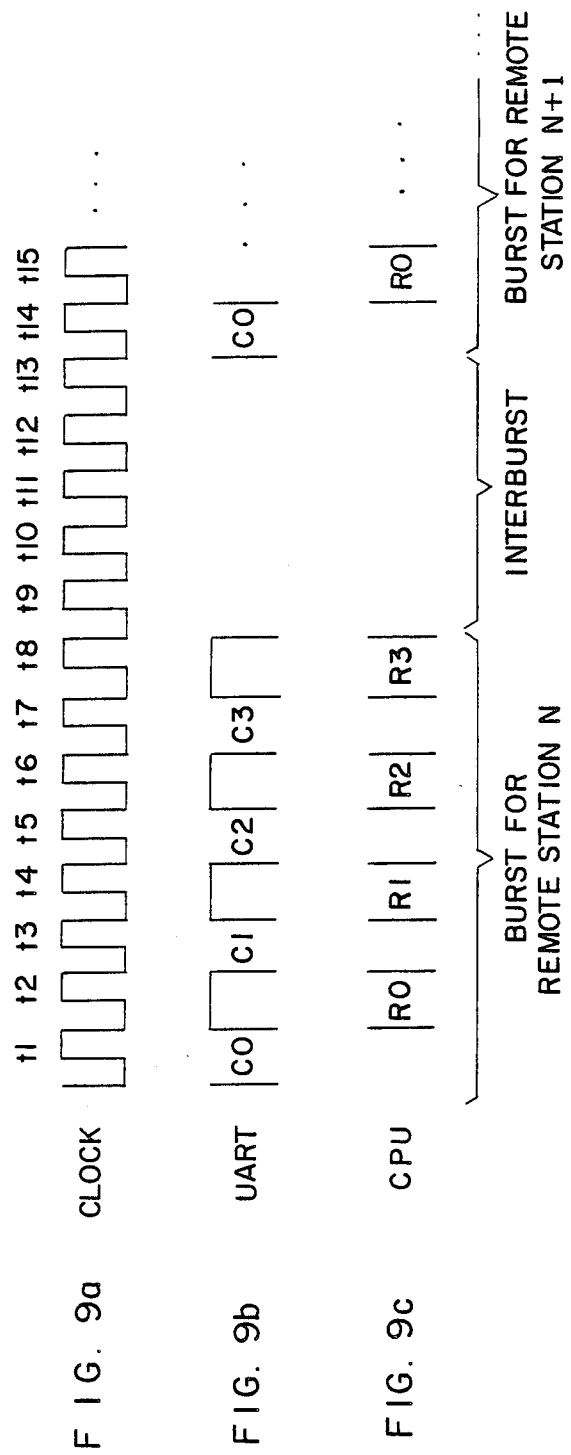

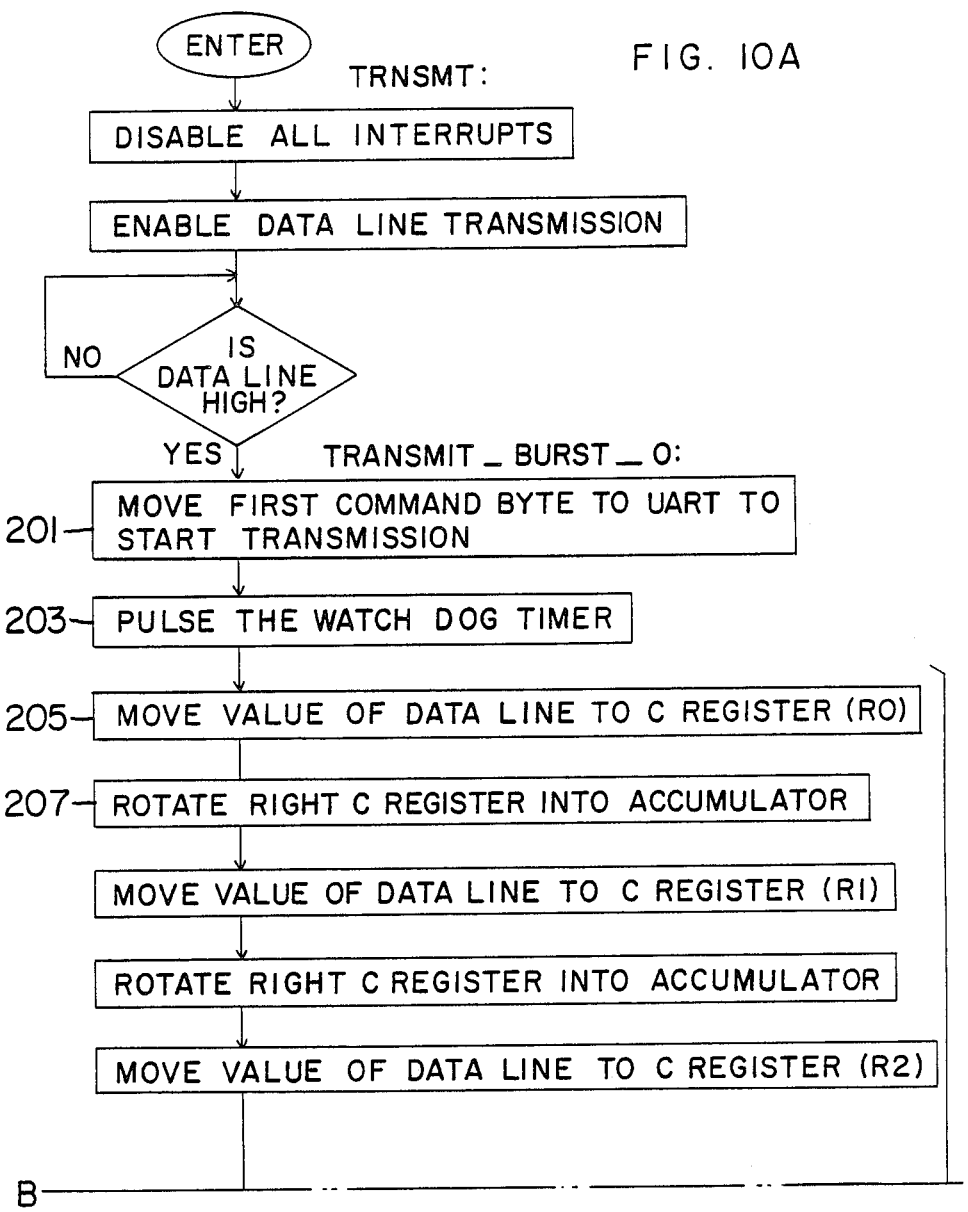

MULTIPLEX SYSTEM INCLUDING SHIELDED CABLE

BACKGROUND OF THE INVENTION

This invention relates to multiplex systems of the type which include a master controller that exchanges data signals with a plurality of remote stations and is connected to the remote stations by a cable. In particular, this invention relates to such a multiplex system which provides reduced EMI/RFI radiation and improved noise immunity.

In multiplex systems of the type referenced above, proper shielding of the cable is important to reliable and noise free operation of the multiplex system. If the cable is not shielded properly, electromagnetic interference in the environment may seriously degrade communications between the master controller and the remote stations. Similarly, in multiplex systems having a high rate of data transmission between the master controller and the remote stations, pulses applied to conductors of the cable by either the master controller or the remote stations can themselves generate significant RFI/EMI interference. Proper shielding of the cable is important to reduce the levels of RFI interference generated by the multiplex system. In general, conventional ribbon conductors are not well suited to provide adequate levels of shielding in many multiplex systems.

SUMMARY OF THE INVENTION

The present invention is directed to a multiplex system having an improved shielded cable that substantially reduces RFI/EMI interference without increasing the number of conductors in the cable.

According to this invention a multiplex system is provided which comprises a master controller which comprises means for generating a series of clock pulses on a clock terminal, means for monitoring data on a data terminal, and means for supplying electrical power via first and second power terminals. A plurality of remote stations are connected with the master controller via a cable. Each of the remote stations is adapted to receive power from the power terminals, to receive clock pulses from the clock terminal, and to send data to the data terminal. The cable includes a clock conductor connected to the clock terminal, a data conductor connected to the data terminal, and first and second power conductors connected to the first and second power terminals, respectively. In addition, means are provided for capacitively coupling the power conductors together and means are provided for grounding a selected one of the power conductors. The power conductors are disposed substantially around the clock and data conductors to substantially reduce RF interference generated by the clock and data conductors.

In the preferred embodiment described below, capacitors are included in the remote stations, connected between the two power conductors. One of the two power conductors is grounded and the other is held at +5 VDC. The grounded power conductor provides an excellent shield for one of the clock and data conductors, and the +5 VDC conductor provides an excellent shield for the other of the clock and data conductors. This is because the +5 VDC conductor is heavily capacitively coupled to the grounded conductor.

This invention provides important advantages in that the clock and data conductors are shielded effectively, both with respect to RFI emissions and to noise in the environment. All of this is obtained without increasing the number of conductors in the cable. This is because the power conductors simultaneously perform a power transmission function and a shielding function.

The invention itself, together with further objects and attendant advantages, will best be understood by reference to the following detailed description, taken in conjunction with the accompanying drawings.

BRIEF DESCRIPTION OF THE DRAWINGS

FIGS. 2a and 2b are an electrical schematic diagram of the master controller included in the multiplex system of FIG. 1.

FIG. 4 is a schematic representation of one of the remote stations included in the multiplex system of FIG. 1.

FIG. 5 is a schematic representation of one of the remote stations of FIG. 1 coupled to a keyboard.

FIG. 6 is a perspective view in partial cut away of a cable included in the multiplex system of FIG. 1.

FIG. 7 is a cross-sectional representation of an alternative form of the cable of FIG. 6.

FIG. 8 is a timing diagram for the multiplex system of FIG. 1.

FIGS. 9a, 9b and 9c are timing diagrams for the multiplex system of FIG. 1.

DETAILED DESCRIPTION OF THE PRESENTLY PREFERRED EMBODIMENTS

Figure 1:
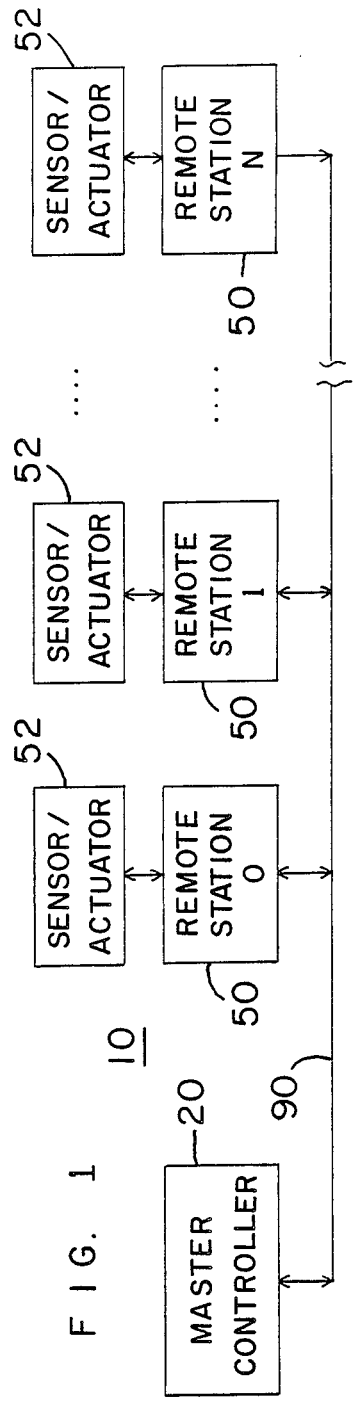
FIG. 1 is a schematic representation of a presently preferred embodiment of the multiplex system of this invention.

Turning now to the drawings, FIG. 1 shows a schematic representation of a multiplex system 10 which incorporates a presently preferred embodiment of this invention. This multiplex system 10 includes a master controller 20 which is coupled to a number of remote stations 50 by a cable 90. Each of the remote stations 50 is in turn coupled to a respective sensor/actuator 52. The master controller 20 directs command signals to the remote stations 50, which in turn latch these command signals and apply the command signals to the associated sensor/actuator 52 in order to control the sensor/actuator 52. In addition, the master controller 20 polls the remote stations 50 for response signals supplied to the remote stations 50 by the sensor/actuators 52. The sensor/actuators 52 can take a wide variety of forms, and can include, for example, solenoids or switches to be controlled by the master controller 20 or sensors or switches such as keyboards, proximity switches or the like.

Figure 2A:
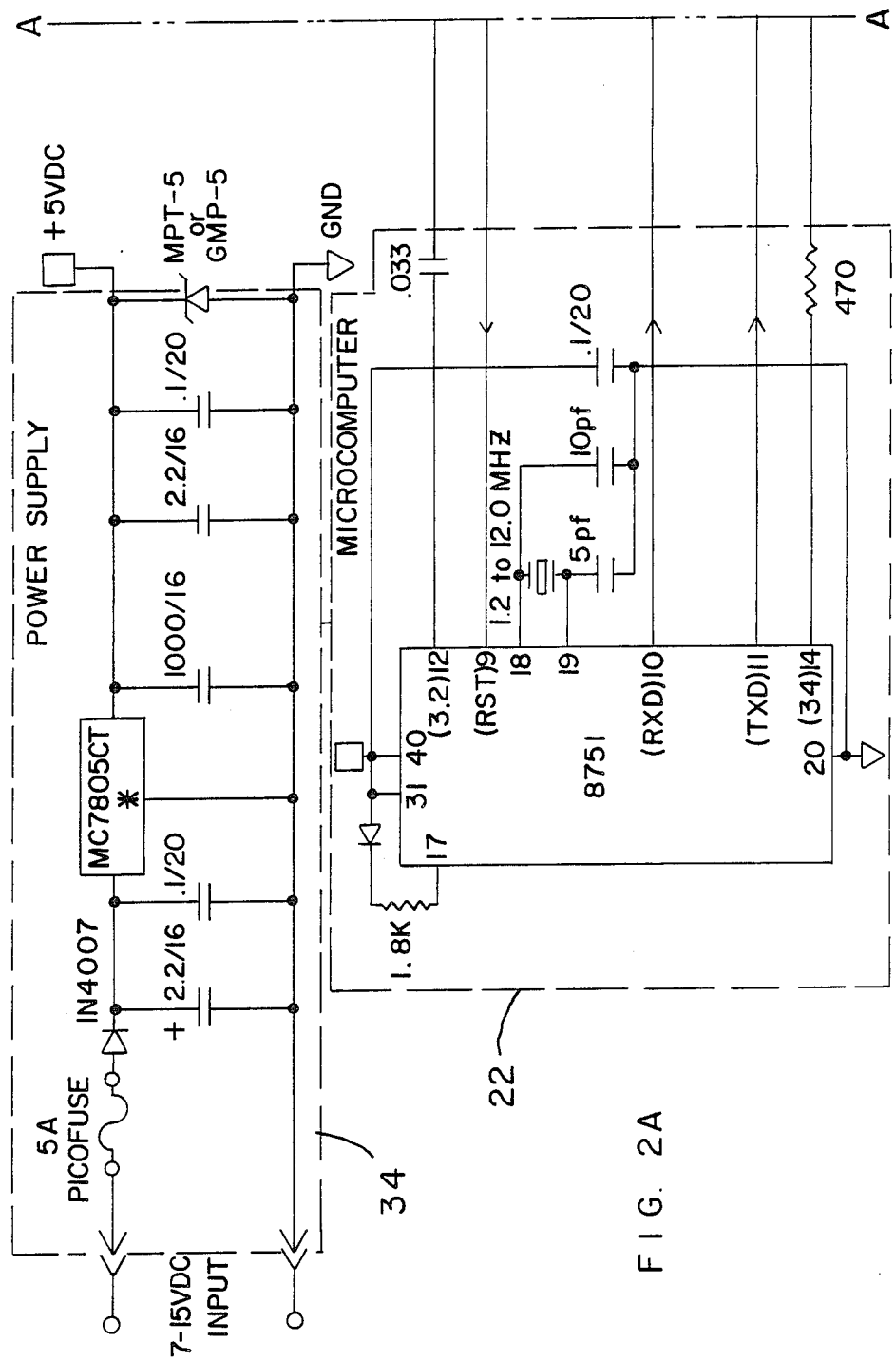

FIGS. 2a and 2b show an electrical schematic diagram of the master controller 20 of FIG. 1. As shown in FIGS. 2a and 2b, the master controller 20 includes a microcomputer 22, a power supply 34, a watch dog timer 36, and a line driver 32. The power supply 34 supplies +5 VDC and 0 VDC.voltages to circuits of the master controller 20 and via the cable 90 to the remote stations 50. The microcomputer 22 in this preferred embodiment is implemented as an Intel 8751 integrated circuit coupled to a 12 MHz crystal. The microcomputer 22 is coupled via the line driver 32 to the cable 90. As explained in greater detail below, the microcomputer 22 generates a periodic, square wave clock signal on a clock conductor 92 included in the cable 90, which is used to synchronize the operation of the remote stations 50. In addition, the microcomputer 22 transmits command signals to the remote stations 50 and monitors response signals from the remote stations 50 via a data conductor 94 included in the cable 90.

The watch dog timer 36 is connected to the microcomputer 22 by conductors 38, 40. The microcomputer 38 is programmed to issue a pulse on the conductor 38 at least once every millisecond. The watch dog timer 36 monitors the pulses on the line 38. In the event the microcomputer 22 fails to issue a pulse on line 38 for a selected time period (slightly greater than one millisecond in this embodiment), the watch dog timer 36 generates a reset pulse on line 40 which resets the microcomputer 22. Each of the components of the master controller 20 is a standard, readily obtainable component. For this reason, these components will not be described here in greater detail.

Figure 3:
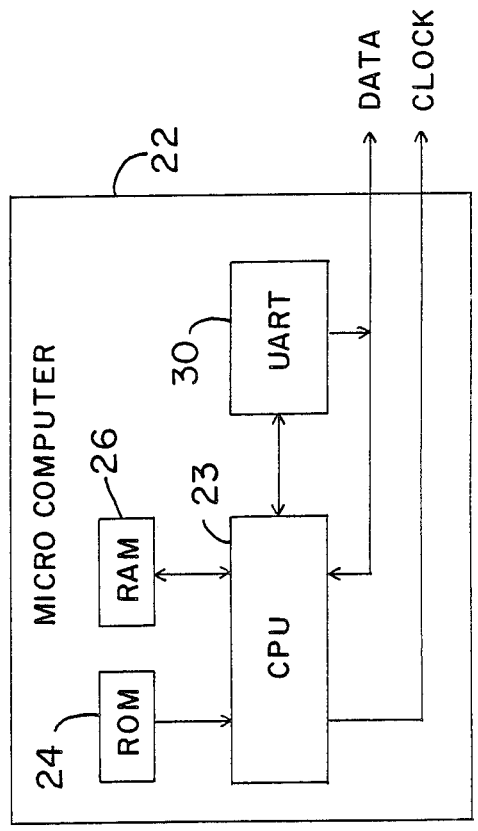
FIG. 3 is a schematic representation of internal components of the microcomputer included in the master controller of FIG. 2.

FIG. 3 shows a schematic representation of the microcomputer 22. As shown in FIG. 3, the microcomputer 22 includes a Central Processing Unit or CPU 23 which is coupled to both a read-only memory 24 and a random access memory 26. In the conventional manner the read-only memory 24 stores the program to be executed by the CPU 23 and the random access memory 26 is used by the CPU 23 for the storage of variables. The microcomputer 22 includes an on board interface buffer 30 commonly known in the art as a UART. The UART is coupled both to the CPU 23 and to the data conductor on the cable 90. As explained below in greater detail, the UART can be used to transmit command bits on the data conductor. Briefly, when the CPU 23 loads an 8-bit byte into the UART 30, the UART 30 is started. Once the UART 30 is started, the UART 30 outputs the previously loaded 8 bit byte onto the data conductor, without further supervision or control by the CPU 23.

As shown in FIG. 4, each of the remote stations 50 includes three basic subcircuits: an addressing and gating circuit 54, a set of four command latches 56, and a selector circuit 58. The selector circuit 58 is coupled to the data conductor of the cable 90, and the addressing and gating circuit 54 is coupled to the clock conductor of the cable 90. The addressing and gating circuit 54 counts pulses on the clock conductor, and at a predetermined count enables the selector 58. For the next eight periods of the clock signal on the clock conductor the selector circuit 58 sequentially interconnects the data conductor on the cable 90 with the response inputs R0–R3 and the command latches for the command outputs C0–C3. The selector circuit 58 is arranged such that the response signals alternate with the command signals on the data conductor. In this embodiment, the data conductor is connected with the response inputs and the command outputs in the following sequence: C0, R0, C1, R1, C2, R2, C3, R3. The detailed circuitry of the remote station 50 is described and illustrated in FIG. 3 of co-pending U.S. patent application Ser. No. 06/567,476, filed Jan. 3, 1984, entitled "A Time-Slot Addressed, System Keyed Multiplex Device," which is assigned to the assignee of this invention. The specification of this application is hereby incorporated by reference in the present specification for its teaching of the detailed circuitry of the remote station 50.

As shown in FIG. 4, each of the remote stations 50 includes a capacitor 60 interconnecting the +5 VDC and the ground inputs. As explained below, this capacitive coupling between the two power conductors of the cable 90 is provided to improve noise immunity and reduce RFI and EMI emissions associated with the high frequency signals on the data and clock conductors. Preferably, the capacitor 60 is 0.1 microfarads, and a capacitor is provided across the ground and +5 VDC conductors at least every twenty feet along the length of the cable 90 in this embodiment. In the event the remote stations 50 are spaced at greater intervals than twenty feet, separate capacitors are preferably used to provide the desired capacitive filtering.

FIG. 5 is a schematic representation which shows the manner in which one of the remote stations 50 is connected with a keyboard 70. As shown in FIG. 5, the keyboard 70 includes four row conductors 72 and four column conductors 74. A respective switch 76 is provided at each node in the grid defined by the row conductors 72 and the column conductors 74. Each switch 76 is coupled to a touch pad and is normally open in this embodiment such that the row conductors are isolated from the column conductors when the switches 76 are in their rest state. A row conductor 72 can be shorted to a selected one of the column conductors 74 by depressing the appropriate switch 76. Any suitable keyboard 70 can be used; for example the keyboards sold by AMP Incorporated as AMP Part Nos. 923792 and 923515 have been found to be suitable. Of course, the number of row and column conductors may be altered as necessary for the intended application.

As shown in FIG. 5, each of the row conductors 72 is connected to a respective one of the command outputs C0–C3, and each of the column conductors 74 is connected to a respective one of the response inputs R0–R3. Thus, the master controller 20 can apply any desired signal pattern on the row conductors 72 and then monitor the column conductors 74 to determine which of the switches 76 have been activated. As explained in greater detail below, the keyboard 70 is scanned by sequentially placing the following signal patterns on the row conductors 72: 0111, 1011, 1101, 1110, where "1" indicates +5 VDC and "0" indicates 0 VDC. In this specification and the following claims, the terms "row conductor" and "row" are used to designate the conductors which are scanned, and can be oriented horizontally or vertically. Similarly, the terms "column conductor" and "column" are used to designate the conductors which are sensed.

FIG. 6 shows a perspective view in partial cut away of a presently preferred embodiment of the cable 90. The cable 90 includes two co-axial cables. These co-axial cables include center conductors 92, 94 which are preferably the clock and data conductors, respectively. Each of the conductors 92, 94 is surrounded by a low loss insulator 96, which is in turn surrounded by a respective sheath conductor 98, 100. Preferably, the sheath conductors 98, 100 are connected to the +5 VDC and ground terminals of the master controller 20, respectively. The sheath conductors 98, 100 are imbeded in an extruded insulator 102. The insulator 102 defines a key 104 at one edge to indicate the polarity of the cable 90.

Preferably, the clock and data conductors 92, 94 are about 14 AWG and the power and ground conductors 98, 100 are co-axial braids having a relatively large cross section (about 12 AWG). The ground conductor 100 is grounded by the master controller 20 and thus provides an excellent shield for the data conductor 94. Because the power conductor 98 is capacitively coupled to the ground conductor 100 by the capacitors 60, the power conductor 98 also provides an excellent shield. The dielectric between the inner conductors 92, 94 and the sheath conductors 98, 100 is preferably a low loss, low dielectric constant material such as polyethylene. The outer insulator 102 should be chosen for mechanical, cost, and environmental factors. In many applications PVC is well suited for use as the outer insulator 102.

As pointed out above, high frequency square wave signals are transmitted on the clock and data conductors 92, 94, and the sheath conductors 98, 100 in this embodiment serve three important functions: (1) they transmit power to the remote stations 50; (2) they shield the clock and data conductors 92, 94 from noise; and (3) they prevent excessive EMI and RFI interference from being broadcast by the clock and data conductors 92, 94. The remote stations 50 can be interconnected with the cable 90 by the use of conventional connectors such as the low profile co-ax taps marketed by AMP Incorporated as AMP Part No. 228752-1.

FIG. 7 shows a cross-sectional view of an alternate embodiment 90' of the cable 90. In the embodiment of FIG. 7 the clock and data conductors 92', 94' are positioned between spaced, parallel power and ground conductors 98', 100'. The entire assembly is surrounded by an insulator 102' which includes a key 104' to indicate polarity. In the cable 90' the power and ground conductors 98', 100' substantially surround the clock and data conductors 92', 94', thereby providing excellent shielding in a manner similar to that of the sheath conductors 98, 100. Of course, in other embodiments other geometries can be used in which the power and ground conductors substantially surround the data and clock conductors to provide the shielding advantages described above.

Table 1 provides an index of Appendices 1-5 included with this specification. Each Appendix includes a source and object code listing of a respective routine included in the program executed by the master controller 20. Appendices 1 and 2 provide the listing for the main executive, and are provided to define the environment in which the programs of Appendices 3-5 operate. For this reason, the routines of Appendices 1 and 2 will not be discussed in detail. Here, it is enough to note that the routines of Appendices 1 and 2 define the repetitive cycle shown diagrammatically in FIG. 8.

TABLE 1

| Appendix Number | Routine Name | Routine Function |
|---|---|---|
| 1 | TSMEB2 | Main Executive (Part 1) |
| 2 | TSMEP1 | Main Executive (Part 2) |
| 3 | TSTRN0 | Remote Station Polling Routine |
| 4 | TSSRK1 | Keypad Service Routine |
| 5 | TSDK10 | Decode Keypad Routine |

In FIG. 8 the symbols RS0, RS1, . . . RS15 are used to designate burst periods during which the master controller 20 communicates with remote stations 0, 1, . . . , 15, respectively. For example, during the burst period RS0 the master controller 20 transmits four command bits C0-C4 to remote station 0 and receives four response bits R0-R3 from remote station 0 via the data conductor 94. In FIG. 8 the symbol IB is used to designate an interburst period, which in this embodiment is five microseconds in duration. An interburst period is interposed between each adjacent pair of burst periods for consecutively addressed remote stations.

As shown in FIG. 8 the period of each complete cycle of the program executed by the master controller 20 is in this embodiment 503 microseconds. During the initial 208 microseconds, four command bits and four response bits are exchanged between each of the remote stations 50 and the master controller 20. During this initial period the master controller 20 merely stores the response bits received from the remote stations 50 for later processing. The second portion of the cycle is a processing period, which lasts for 295 microseconds in this embodiment. During the processing period the master controller 20 processes the response bits received from the remote stations 50 and determines the command bits to be sent to the remote stations 50 during the next cycle. This cycle is repeated continuously during operation of the master controller 20.

Appendix 3 provides a listing for TSTRN0, the routine executed during the polling period of FIG. 8. This routine utilizes the UART 30 to transmit the response bits R0-R3 and utilizes the CPU 23 to read the command bits C0-C3. FIGS. 9a through 9c illustrate the timing of a burst and interburst period. As shown in FIG. 9a, the clock signal on the clock conductor 92 of the cable 90 is a square wave, which in this preferred embodiment has a frequency of 1 MHz. For purposes of discussion, consecutive periods of the clock signal of FIG. 9a are labeled t1-t15. The clock signal defines a sequence of time slots for the remote stations 50.

As shown in FIGS. 9b and 9c, the UART 30 transmits a command byte which comprises command bits C0, C1, C2, C3 during time slots t1, t3, t5, and t7. The command byte also includes spacer bits in which the data line is driven to the logic high state. One of these spacer bits follows each of the command bits C0-C3 in time slots t2, t4, t6, t8. Simultaneously with the transmission of C0-C3 by the UART 30, the CPU 23 reads response bits R0-R3 during time slots t2, t4, t6 and t8, respectively. Because the UART 30 drives the data line 94 high during time slots t2, t4, t6 and t8, operation of the UART 30 does not interfere with transmission of the response bits R0-R3 by the remote stations 50. After an interburst period t9-t13 the foregoing sequence is repeated for the next remote station in sequence.

Figure 10B:
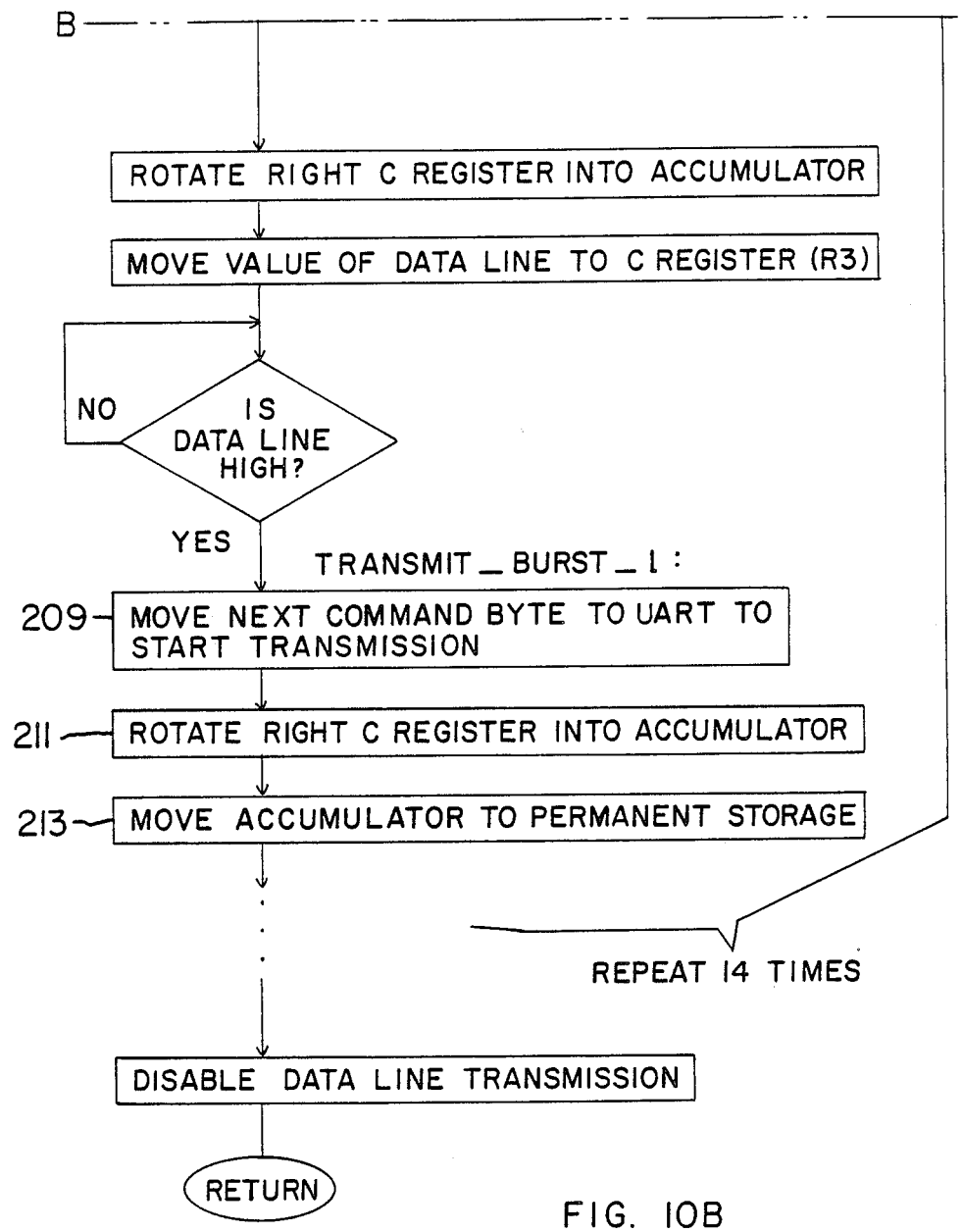
FIGS. 10a,b, 11a,b and 12a,b are flow charts of software routines executed by the microcomputer of the master controller of FIGS. 2 and 3.

FIGS. 10a and 10b are a flow chart of the transmit routine of Appendix 3. As shown in FIGS. 10a and 10b, this routine first disables all interrupts. Timing is critical during the polling period, and interrupts could cause the CPU 23 to lose syncronization with the UART 30. The line driver 32 is then enabled and the routine checks that the data line 94 is high. If not (indicating a failure in the data line), the routine locks up at this point until the watch dog timer 36 resets the microcomputer 22. Assuming the data line 94 is high, the routine then transmits Burst 0 through Burst 15 in strict sequence. In order to obtain the desired timing, loops have been avoided and for this reason the programming is quite redundant. However, this approach provides the advantage of minimizing execution time and providing strict control over timing. Each of the Bursts 0-15 is addressed to a respective one of the 16 remote stations 50 of this embodiment.

As shown at block 201, the first step in transmitting Burst 0 is to move the first command byte to the UART 30. This initiates operation of the UART 30. As the UART 30 is transmitting the first command bit C0, the routine in FIG. 10 pulses the watch dog timer at block 203. By the time the watch dog timer has been pulsed, the UART 30 is transmitting the first spacer bit (during time slot t2 of FIG. 9a). During time slot t2 the routine of FIG. 10 reads the value from the data line 94 and transfers it to the C-register at block 205. During time slot t3, when the UART 30 is transmitting the second command bit C1, the routine of FIG. 10 rotates the C-register right into the accumulator at block 207. This pattern is repeated until all four command bits C0–C3 have been transmitted during time slots t1, t3, t5, and t7 and all four response bits R0–R3 have been read during time slots t2, t4, t6, t8. In each case the response bits R0–R3 are read by the CPU 23 during a time slot when the UART 30 is transmitting a spacer bit. In this way, the microcomputer 22 appears to be operating simultaneously to transmit the command bits C0–C3 and to read the response bits R0–R3.

After response bits R0–R3 for remote station 0 (Burst 0) have been received, the routine of FIG. 10 next checks to insure that the data line 94 is high. Then Burst 1 is transmitted to remote station 1, starting at block 209, by moving the second command byte to the UART 30, thereby initiating transmission of the second command byte. While the UART 30 is transmitting the first command bit C0 of the second command byte, the routine of FIG. 10 moves the last value for the data line for response byte 0 into the C-register at block 211 and then moves the accumulator to permanent storage at block 213. The routine of FIG. 10 then reads response bits R0–R3 in the manner described above. This process is repeated 14 times, thereby transmitting command bytes to and reading response bytes from each of the 16 remote stations 50. Of course, in alternate embodiments the number of remote stations 50 can be selected as desired for the particular application.

The routine of FIGS. 10a and 10b utilizes the UART 30 to interleave command bits and response bits on a bit-by-bit basis. This is achieved by utilizing the independent operation of the UART 30 to transmit the command bits while the CPU 23 attends to reading the response bits. Of course, response bits can be read by the UART 30 while command bits are transmitted by the CPU 23. Furthermore, in alternative embodiments the command bits and response bits may be transmitted on separate conductors rather than on the single data conductor 94 of the cable 90.

Figure 11A:
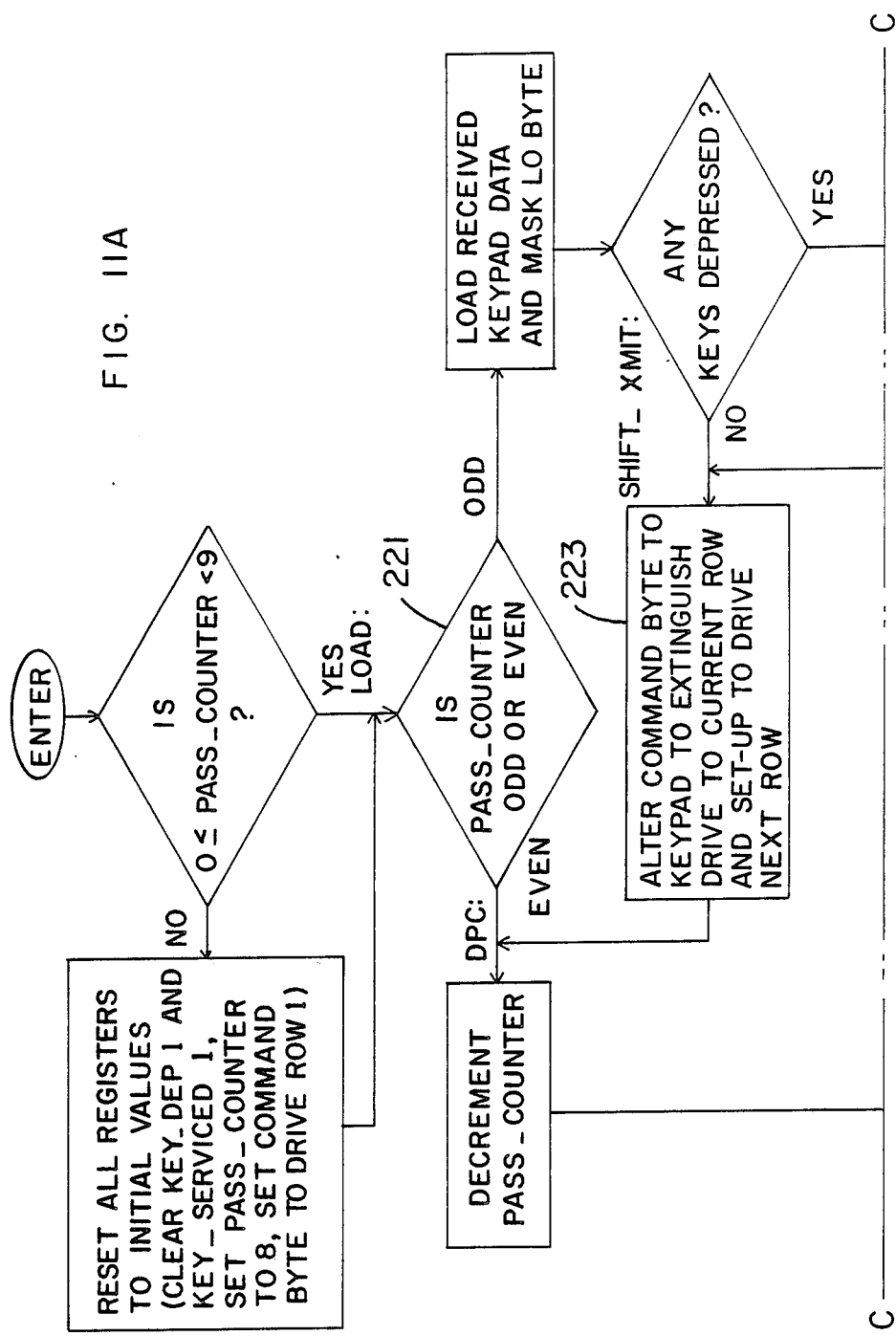
Figure 11B:
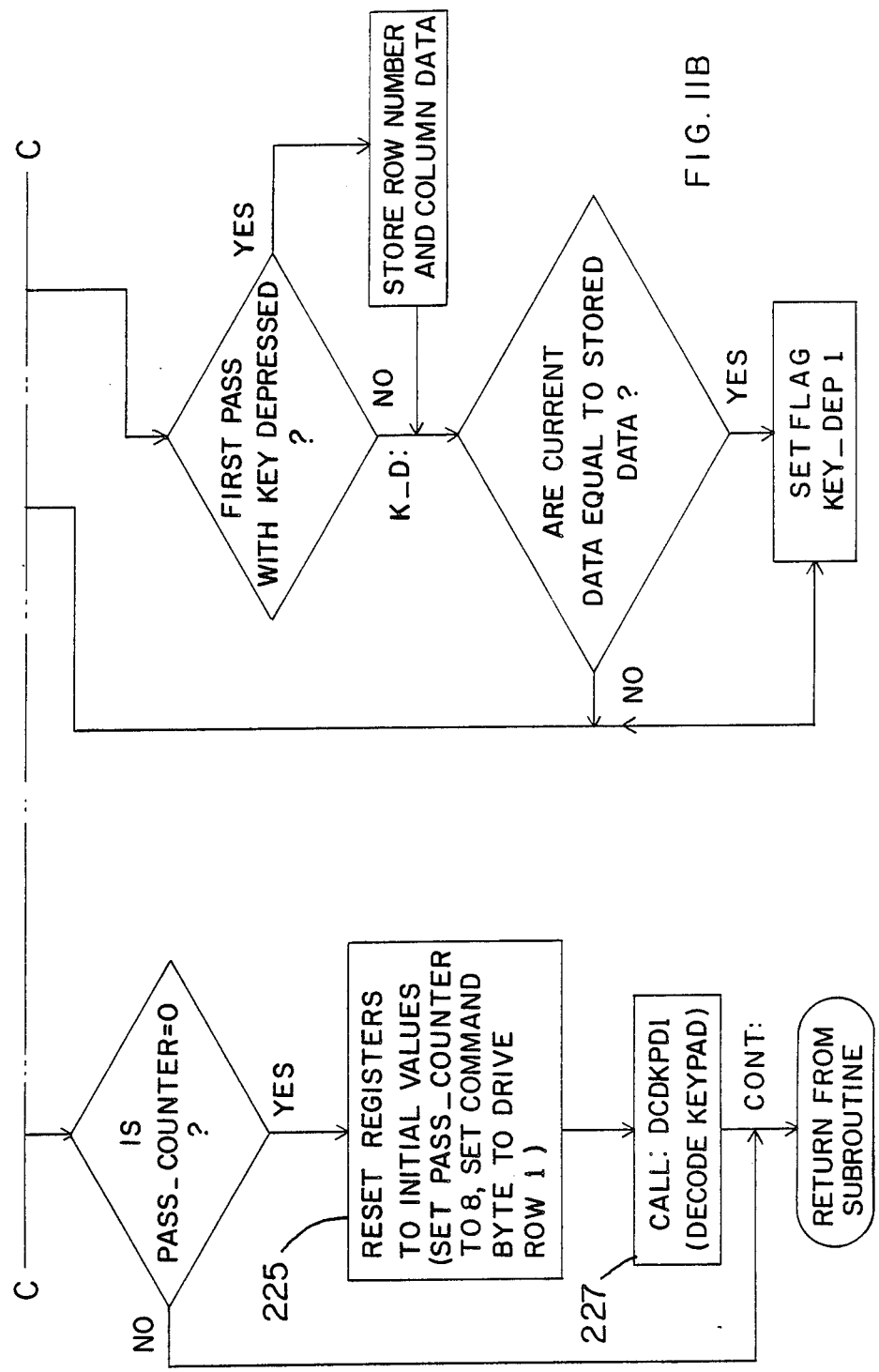

FIGS. 11a and 11b are a flow chart of the keypad service routine of Appendix 4. This routine scans the keyboard 70 in an eight period cycle. During the first period of the cycle Row 1 is grounded while Rows 2–4 are held high. During the second cycle columns one through four are read via response bits R0–R3 to determine if any of the switches on Row 1 are closed. Any closed switches will result in a logic low value in the associated response bit. In cycle three the command bits C0–C3 are reconfigured to ground Row 2 while maintaining Rows 1, 3 and 4 in the logic high state. In cycle four, columns one through four are read to determine if any of the switches on R2 are closed. This process is continued until all four of the rows have been scanned. The cycle then repeats by again grounding Row 1.

The routine of FIGS. 11a and 11b is executed during the processing period. First the pass counter is checked to determine that it is greater than or equal to zero and less than nine. If not, the pass counter is set equal to eight, the command byte for the relevant remote station 50 is set to drive Row 1 to ground, and the flag KEY— DEP1 and KEY—SERVICED1 are cleared. The pass counter is then checked to determine if it is odd or even. In this embodiment an even value of the pass counter corresponds to a cycle when a new row is driven to ground, and an odd value of the pass counter corresponds to a cycle during which the logical state of the column conductors 74 is determined.

In the first pass of the routine of FIGS. 11a and 11b the command byte has been set to drive Row 1 to ground and the pass counter will be decremented and the subroutine will return. During the next processing period the pass counter will be found equal to the odd value 7 and the flow will branch to the right at decision block 221. The response bits R0–R3 from the remote station 50 connected to the keyboard 70 are then examined to see if any are in the logic low state. If no keys are found to have been depressed, the command byte for the relevant remote station 50 is altered to extinguish the drive to the current row and to drive the next row.

In the event any of the response bits R0–R3 is in the logic low state, the routine of FIGS. 11a and 11b checks to determine whether this is the first pass with a key depressed. If so, the row and column number of the depressed key are stored. The current row and column data are then checked for correspondence with this stored data. In the event of correspondence, the flag KEY—DEP1 is set. KEY—DEP1 is used as an indication that a key has been depressed and that on subsequent cycles it is the same key as in the previous cycle. In either event, the command byte is updated at block 223, and the pass counter is decremented and checked for equality with zero. As before, if the pass counter is not equal to zero the subroutine returns. This process continues until the pass counter is decremented to zero, at which time all four of the rows will have been scanned. The registers are then reset to initial values at block 225 and the decode keypad routine is called at block 227 prior to return.

From this description it should be clear that the multiplex system 10 is well suited for use with the keyboard 70 with an minimum of external hardware. The remote station 50 can be controlled to scan the consecutive rows of the keyboard 70 and to read the consecutive columns, without alteration or modification to the remote station 50. Because each cycle of the master controller 20 takes about 0.5 milliseconds in this embodiment, the entire keyboard 70 is scanned at a rate of about once every four milliseconds.

Figure 12A:
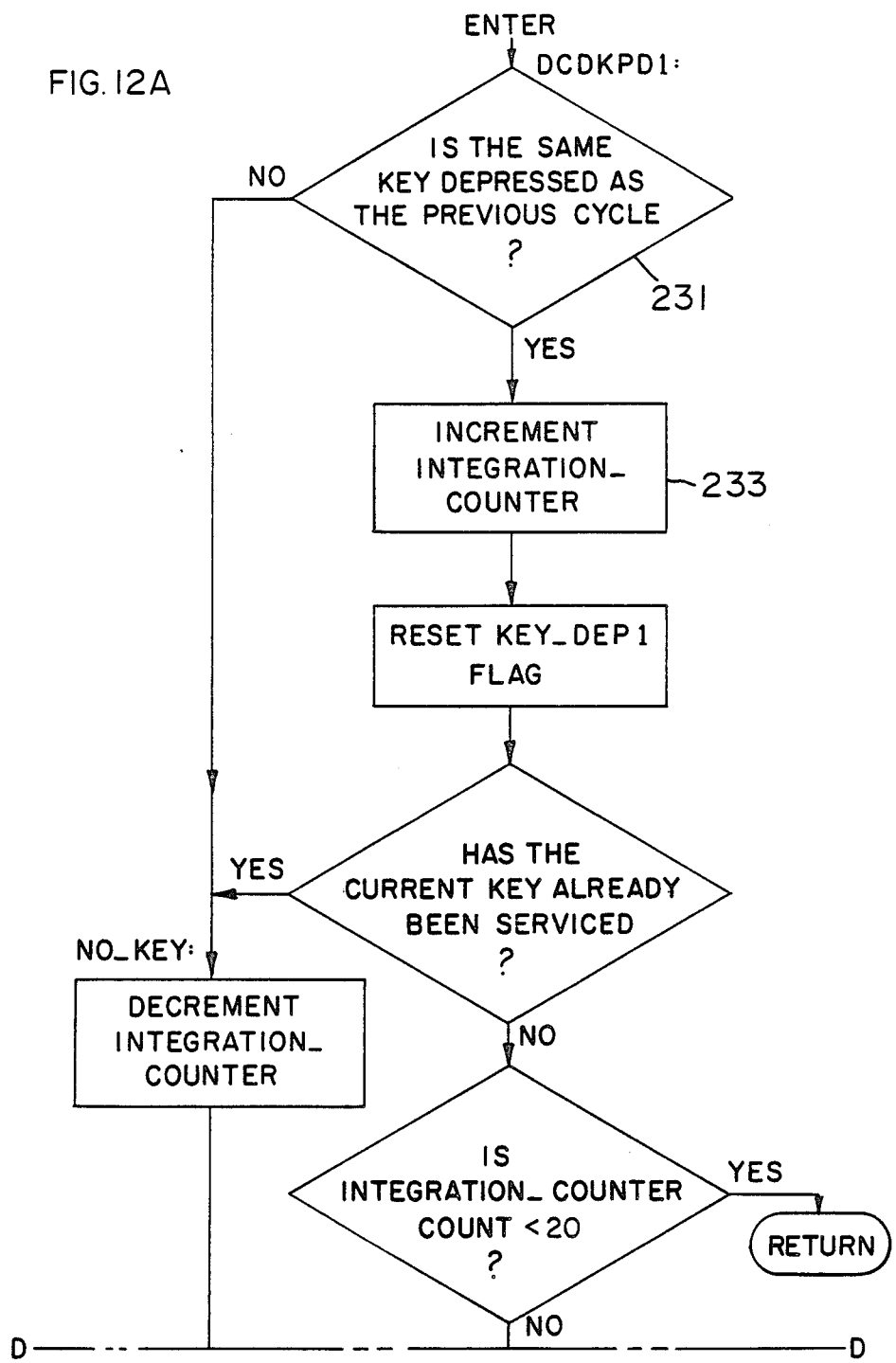
Figure 12B:
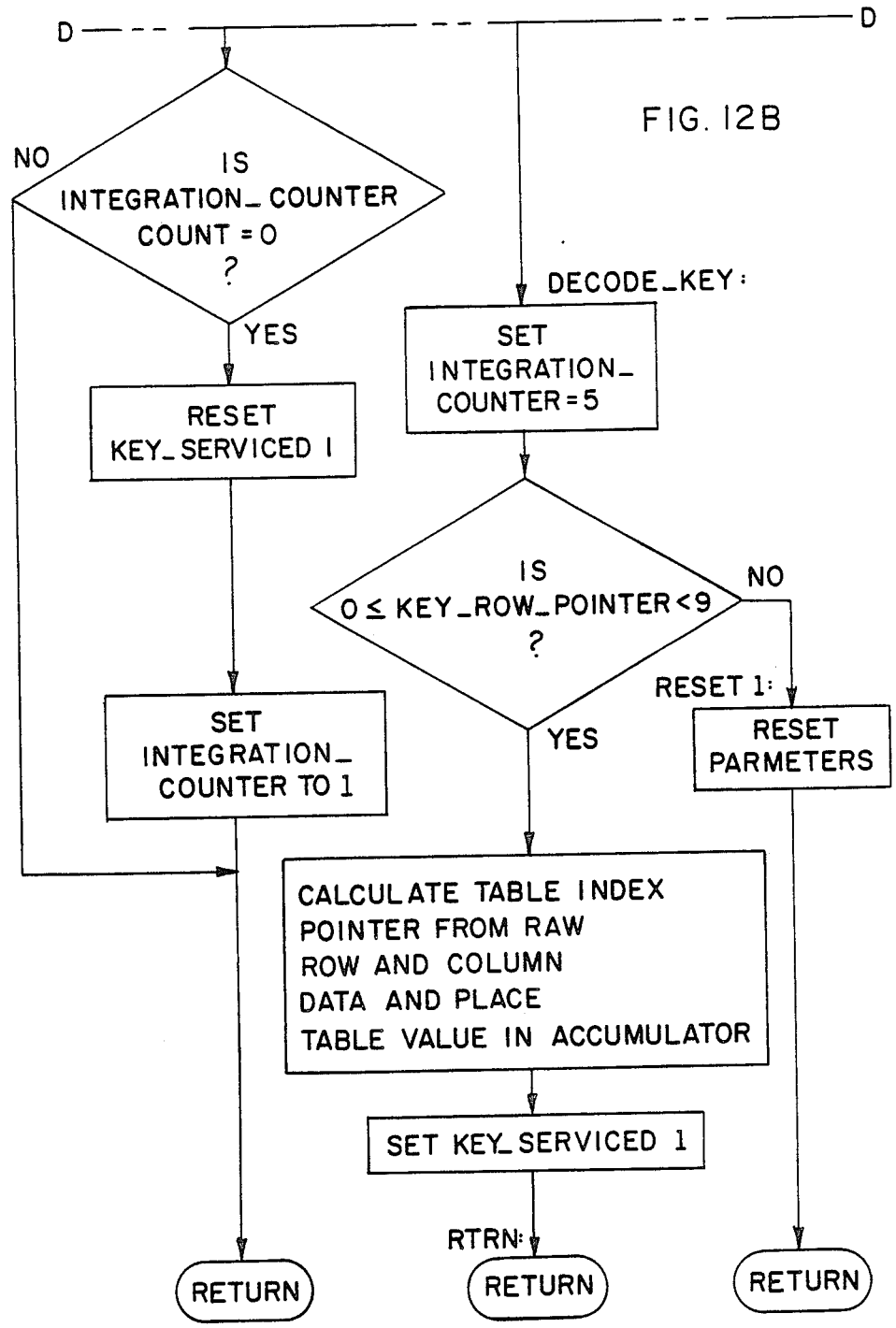

FIGS. 12a and 12b provide a flow chart of the decode keypad routine called by the service keypad routine of FIG. 11. The decode keypad routine of FIGS. 12a and 12b is listed in Appendix 5.

The decode keypad routine starts by checking the flag KEY—DEP1 to determine whether the same key is depressed this cycle as the previous cycle. If so, an integration counter is incremented at block 233 and KEY—DEP1 is reset. The routine then checks KEY—SERVICED1 to determine if the current key has already been serviced. If not, the integration counter is checked to determine if it is less than 20. If so, the routine returns; if not the integration counter is set equal to five and the key is decoded by calculating a table index pointer from the row and column data and placing the table value in the accumulator. The flag KEY—SERVICED1 is then set and the routine returns. In the event the initial decision of decision block 231 indicates that a new key has been depressed or in the event the current key has already been serviced, the integration counter is decremented and checked for equality with zero. If the integration counter is equal to zero the flag KEY_SERVICED1 is reset and the integration counter is set equal to one before the routine returns.

The decode keypad routine of FIGS. 12a and 12b utilizes the integration counter to detect a change of state of the keyboard 70 reliably. While a single key of the keyboard 70 is held down, the integration counter is incremented until it reaches 20. It is only at this point that the key is decoded. If during the period while the key is being held down noise causes a response bit to be lost, the routine of FIG. 12 decrements the integration counter rather than resetting the count is zero. In effect, the integration counter is used to integrate the desired signal and noise interfering with reception of the desired signal. This approach allows the state of the keyboard to be determined reliably, even in the presence of high noise levels. Of course, the exact threshold used for the integration counter can be varied as desired to provide reliable decoding of the keyboard in the anticipated noise environment. Furthermore, in alternate embodiments it may be preferable to increment the counter in response to the signal by a value which differs from the amount by which the counter is decremented in response to absence to the signal. Of course, the term increment is used here in its broad sense, and is meant to include incrementing the counter by a negative number.

From the foregoing, it should be apparent that an improved multiplex system has been described which minimizes RF interference without unnecessarily increasing the number of conductors in the cable 90, which utilizes an independent interface buffer such as a UART to allow command bits and response bits to be interleaved in time at a high data transmission rate utilizing only a single microcomputer. Furthermore, a remarkably simple and efficient use of the multiplex system to control a keyboard has been described, along with an improved decoding approach which allows response signals such as keyboard actuation signals to be decoded reliably, even in a noisy environment.

Of course, it should be understood that a wide range of changes and modifications can be made to the preferred embodiments described above. It is therefore intended that the foregoing detailed description be regarded as illustrative rather than limiting, and that it be understood that it is the following claims, including all equivalents, which are intended to define the scope of this invention.

APPENDIX 1

```
MCS-51 MACRO ASSEMBLER    TSMEB2-Task demo System Main Executive Begining V1.2                    PAGE    1

ISIS-II MCS-51 MACRO ASSEMBLER V2.0
OBJECT MODULE PLACED IN :F0:TSMEB2.OBJ
ASSEMBLER INVOKED BY:  ASM51 TSMEB2.SRC XREF PW(108) TT(TSMEB2-) DA() DB EP WF(:F1:) PR(:F1:TSMEB2.LST)

LOC  OBJ        LINE   SOURCE

1    $TT(TSMEB2-Task demo System Main Executive Begining V1.2) RB(0)
                  2    ;******************************************************************************
                  3    ; ASSUMPTIONS: 1-One Response is to be reserved for the initiation of system
                  4    ;                testing which will cycle every Command "ON" for 1/2 second.
                  5    ;              2-Upon every power-up or depression of the RESET switch, the
                  6    ;                entire internal Data RAM of the 8051 is completely tested
                  7    ;                with an alternating "1" and "0" pattern if any of the test
                  8    ;                registers have been altered, otherwise they are not tested.
                  9    ;              3-Unless noted otherwise all TASK logic is negative true: i.e.
                 10    ;                "0"=ON and "1"=OFF. This includes internal control flags.
                 11    ;              4-Unless noted otherwise all Intel control flags and bits are
                 12    ;                positive true: i.e. "1"=ON and "0"=OFF.
                 13    ;              5-The hardware includes a "Watchdog Timer" to kick the micro-
                 14    ;                computer back into sync in the event that an inadvertant
                 15    ;                "glitch" vectors the computer into "Never-Never Land"!
                 16    ;              6-The Task Network (Clock and Data Lines) is directly driven
                 17    ;                from the UART port through a 75453N Dual Peripheral "OR"
                 18    ;                Driver chip.
                 19    ;              7-The system contains 15 "A" chips.
                 20    ;              8-System format is alternating commands and responses. Logic
                 21    ;                is active low. The UART issues 16 data bursts of 8 bits each.
                 22    ;              9-Responses are stored in internal RAM at 30H to 3FH. Only the
                 23    ;                high nibble of each byte contains desireable data. The most
                 24    ;                significant bit(MSB-bit 7) of a given byte represents the 4th
```

```
25  ;                    response of a particular "A" chip and the 4th bit of a given
26  ;                    byte represents the 1st response of a particular "A" chip.
27  ;               10-All initializations are done in the COLD_START_INITIALIZATION
28  ;                    routine.
29  ;               11-The TASK Data Line is verified to be "1" prior to any
30  ;                    transmission of data. This results in an interburst dead time
31  ;                    of 5 usec with a 12.0 Mhz crystal.
32  ;               12-The Keypads are driven off "A" Chip #7 and #12. Row 1 to Row 4
33  ;                    is connected to C0 to C3 respectively and Column 1 to Column 4
34  ;                    of the keypad is connected to R0 to R3 respectively on the
35  ;                    "A" Chip. Data entry for the keypads when activated are stored
36  ;                    in Register Bank #1 and #2.
37  ;               13-Text Messages are inserted in the code from 100H to 1CFH.
38  ; LIMITATIONS: 1-No more than 16 "A" chips can be used with the technique in
39  ;                    this routine-this is the maximum capacity (however, a maximum
40  ;                    of 32 chips is permissible). Thus, responses fill the RAM area
41  ;                    from 30H to 3FH.
42  ; RESTRICTIONS: 1-All unused program memory area is to be filled with "02"
43  ;                2-This routine IS restricted to receiving a response to a
44  ;                    particular command immediately, i.e. on the current burst of
45  ;                    data. It is assumed that the system can respond immediately.
46  ;                    For example, if a command is issued and received at a
47  ;                    particular "A" chip, within 40 to 50 nSec the response is
48  ;                    driven and immediately read by the controller. Note that this
49  ;                    is not true for the Keypad scanning. The driving of one
50  ;                    particular row on a given "pass" of the system is NOT read
51  ;                    until the following "pass" of the system.
52  ; ACCURACY REQUIREMENTS: 1-Note the following times with a 12 Mhz crystal:
53  ;                        a)16 "A" chips: 13x16+295=503 usec-thus the system
54  ;                                        is executed 171.77 million times
55  ;                                        per day!
56  ;                        b)The TASK Clock has a 1 Mhz Bit Rate
57  ;                       2-Range of the Clock crystal is 1.2Mhz to 12.0 Mhz
58  ; METHODS USED: 1-A 62.5 millisecond to 8 second timer is established with
59  ;                    Timer0 and register P2. It is interrupt driven; however,
60  ;                    the interrupt system is disabled during any Transmission
61  ;                    via the UART. The interupt routine starts at code 0BH. Each
62  ;                    entry to the routine reloads TL0 and TH0 and increments P2
63  ;                2-The reset entry point at 00 vectors the program execution to
64  ;                    202H where the test memory registers are checked.
65  ; ALGORITHM DEFINITIONS: None
66  ; PRE-REQUISITES: NONE
67  ; INPUTS:
68  ;    -I/O: None
69  ;    -REGISTERS: None
70  ;    -MAILBOXES: 17H,19H,70H,7AH
71  ;    -FLAGS: None
72  ; OUTPUTS:
73  ;    -I/O: P2
74  ;    -REGISTERS: TL0,TH0
75  ;    -MAILBOXES: 17H,19H,60H,6EH,6FH,70H,7AH
76  ;    -FLAGS: None
77  ; REGISTERS USED: ACC
78  ; MAXIMUM STACK DEPTH: 0 - not used
79  ; SUBROUTINES CALLED: None
80  ; BRANCHING: None
81  ; TEST CRITERIA: Test all functional aspects of this module with the EMV51
```

```
                 82    ;                     Emulation Vehicle.
                 83    ; INTERMODULE COMMUNICATION: None
                 84    ; ERROR EXITS: None
                 85    ;
                 86    ; MODULE LENGTH: 3+F+CFH+17=F5H BYTES (249 Dec);10H to 218H-several notes
                 87    ; MODULE EXECUTION TIME: CRYSTAL FREQ. ____12.20____MHZ
                 88    ;                                      MINIMUM TIME;____4.00____USEC
                 89    ;                                      MAXIMUM TIME;____15.20____USEC
                 90    ;                                      INTERRUPT TIME____9.00____USEC
                 91    ;
                 92    ;                                      MIN EXECUTION CYCLES___4___
                 93    ;                                      MAX EXECUTION CYCLES__160__
                 94    ;                                      INTERRUPT CYCLES    ___9___
                 95    ;
                 96    ;*****************************************************************
                 97 +1 9EJ
                 98    ;*****************************************************************
                 99    NAME TASK_MARKETING_DEMO_MAIN_EXEC_BEGIN_V12
                100    CSEG
                101    EXTRN CODE (RAMTST, COLD_START_INITIALIZATION)
                102    PUBLIC SERVICE_TIMER0,AUX_TIMER_A,AUX_TIMER_B,AUX_TIMER_C
                103    USING 0
                104    ;*****************************************************************
                105    ;                     8051 SUBSET DATA MEMORY MAP
                106    ;=================================================================
                107    ;                     BYTE
                108    ;    NAME             ADDRESS          MODULE(S) WHERE USED
                109    ;-----------------------------------------------------------------
FFDC            110         HSTL             SET -36D    ;Half Second Timer0 Loop (also uses R7)
FF0B            111         HSTH             SET -245D   ;Total count=(245-1)x256+36=62,500 and
                112                                      ;  62,500 X 8 = .500 second.
0055            113         RNDM1            SET 55H
00AA            114         RNDM2            SET 0AAH
004D            115         RNDM3            SET 01001101B
00B1            116         RNDM4            SET 10110001B
0017            117         MEMCHK1          DATA 17H
0019            118         MEMCHK2          DATA 19H
006D            119         AUX_TIMER_C      DATA 6DH
006E            120         AUX_TIMER_B      DATA 6EH
006F            121         AUX_TIMER_A      DATA 6FH
0070            122         MEMCHK3          DATA 70H
007A            123         MEMCHK4          DATA 7AH
00A0            124         TIME_FLAG_REG    DATA P2
                125    ;*****************************************************************
                126    ;                  8051 SUBSET DATA MEMORY MAP - CONT'D
                127    ;=================================================================
                128    ;                     BIT
                129    ;    NAME             ADDRESS          MODULE(S) WHERE USED
                130    ;-----------------------------------------------------------------
                131    ;    None
                132    ;*****************************************************************
                133    ;
                134    ;~~~~~~~~~~~~~~~~~~~~~~~~~~~~~~~~~~~~~~~~~~~~~~~~~~~~~~~~~~~~~~~~~
                135    ;*  NOTE: FILL ALL PROGRAM MEMORY LOCATIONS WITH 02 PRIOR TO LOADING THIS   *
                136    ;*        FILE INTO MEMORY. THUS, ANY RANDOM BRANCHES TO EMPTY LOCATIONS    *
                137    ;*        WILL LONG JUMP TO 0202H.                                          *
                138    ;~~~~~~~~~~~~~~~~~~~~~~~~~~~~~~~~~~~~~~~~~~~~~~~~~~~~~~~~~~~~~~~~~
```

```
                    139  ;
                    140  ;////////////////////////////////////////////////////////////////////////
                    141  ;/                                                                      /
                    142  ;/           --- The ROM Coding Begins Here ! ! ! ---                   /
                    143  ;/                                                                      /
                    144  ;////////////////////////////////////////////////////////////////////////
                    145  ;
0000                146      ORG 00H
0000 020202         147      JMP MEMCHK
                    148 +1 $EJ
                    149  ;########################################################################
                    150  ;#                                                                      #
                    151  ;#              INTERRUPT SERVICE ROUTINE FOR TIMER0                    #
                    152  ;#                                                                      #
                    153  ;########################################################################
                    154  ;
000B                155      ORG 0BH              ;Interrupt Service Routine Location for Timer0
                    156                           ; Length - 18H or 24 Dec
                    157                           ; Min Execution Time - 11 usec @ 12 MHz
                    158                           ; Max Execution Time - 15 usec @ 12 MHz
                    159  SERVICE_TIMER0:
000B 758ADC         160      MOV TL0,#HSTL        ;Reload Timer0 registers
000E 758C0B         161      MOV TH0,#HSTH
0011 05A0           162      INC TIME_FLAG_REG    ;T_F_R contains 8 oscillator flags from 62.5
                    163                           ; msec to 8 sec (8 Hz to 1/16 Hz respectivly)
                    164                           ; T_F_R.0=8 Hz to T_F_R.7=1/16 Hz) - free run
0013 156F           165      DEC AUX_TIMER_A
0015 156E           166      DEC AUX_TIMER_B
0017 156D           167      DEC AUX_TIMER_C
0019 32             168  INTRET: RETI
                    169  ;
                    170  ;
                    171  ;########################################################################
                    172  ;#                                                                      #
                    173  ;#                     PROGRAM ENTRY LOCATION                           #
                    174  ;#                                                                      #
                    175  ;########################################################################
                    176  ;
0202                177      ORG 0202H            ;PROGRAM ENTRY POINT
                    178  ;
                    179  MEMCHK:                  ;Test Memory cells to determine whether RAM should be
                    180                           ; tested! If not, jump to COLD_START_INITIALIZATION.
                    181                           ; Note: all 4 locations must have the proper value!
0202 E517           182      MOV A,MEMCHK1
0204 B45500  F      183      CJNE A,#RNDM1,RAMTST
0207 E519           184      MOV A,MEMCHK2
0209 B4AA00  F      185      CJNE A,#RNDM2,RAMTST
020C E570           186      MOV A,MEMCHK3
020E B44D00  F      187      CJNE A,#RNDM3,RAMTST
0211 E57A           188      MOV A,MEMCHK4
0213 B4B100  F      189      CJNE A,#RNDM4,RAMTST
0216 020000  F      190      JMP COLD_START_INITIALIZATION
                    191  END
```

XREF SYMBOL TABLE LISTING

| NAME | TYPE | VALUE | ATTRIBUTES AND REFERENCES |
|---|---|---|---|
| AUX_TIMER_A | D ADDR | 006FH | A PUB  102 121# 165 |
| AUX_TIMER_B | D ADDR | 006EH | A PUB  102 120# 166 |
| AUX_TIMER_C | D ADDR | 006DH | A PUB  102 119# 167 |
| COLD_START_INITIALIZATION | C ADDR | ---- | EXT  101# 190 |
| HSTH | NUMB | FF0BH | A  111# 161 |
| HSTL | NUMB | FFDCH | A  110# 160 |
| INTRET | C ADDR | 0019H | A  168# |
| MEMCHK | C ADDR | 0202H | A  147 179# |
| MEMCHK1 | D ADDR | 0017H | A  117# 182 |
| MEMCHK2 | D ADDR | 0019H | A  118# 184 |
| MEMCHK3 | D ADDR | 0070H | A  122# 186 |
| MEMCHK4 | D ADDR | 007AH | A  123# 188 |
| P2 | D ADDR | 00A0H | A  124 |
| RAMTST | C ADDR | ---- | EXT  101# 183 185 187 189 |
| RNDM1 | NUMB | 0055H | A  113# 183 |
| RNDM2 | NUMB | 00AAH | A  114# 185 |
| RNDM3 | NUMB | 004DH | A  115# 187 |
| RNDM4 | NUMB | 0031H | A  116# 189 |
| SERVICE_TIMER0 | C ADDR | 006BH | A PUB  102 159# |
| TASK_MARKETING_DEMO_MAIN_EXEC_B | ---- | ---- | 99 |
| TH0 | D ADDR | 008CH | A  161 |
| TIME_FLAG_REG | D ADDR | 00A0H | A  124# 162 |
| TL0 | D ADDR | 008AH | A  160 |

REGISTER BANK(S) USED: 0, TARGET MACHINE(S): 8051

ASSEMBLY COMPLETE, NO ERRORS FOUND

APPENDIX 2

MCS-51 MACRO ASSEMBLER    TSMEP1 - Task demo System Main Executive Program V1.1                PAGE    1

ISIS-II MCS-51 MACRO ASSEMBLER V2.0
OBJECT MODULE PLACED IN :F0:TSMEP1.OBJ
ASSEMBLER INVOKED BY: ASM51 TSMEP1.SRC XREF PW(108) TT(TSMEP1-) DA() DB EP WF(:F1:) PR(:F1:TSMEP1.LST)

```
LOC  OBJ        LINE    SOURCE

1      $TT(TSMEP1 - Task demo System Main Executive Program V1.1)
                 2      ;**********************************************************************
                 3      ; ASSUMPTIONS: 1-This software drives the Task Marketing Board which displays
                 4      ;                5 different typical systems in which the TASK network could be
                 5      ;                used: Automotive, Office Copier, Building Security, White
                 6      ;                Appliance, and Energy Management.
                 7      ;              2-The Hardware is comprised of a 12 volt DC Gel-cell battery
                 8      ;                which is charged by a modified battery charger from Globe. The
                 9      ;                charger will supply 750 ma when the system is "ON" and only
                10      ;                350 ma when the system is "OFF". The controller board is the
                11      ;                same one used in the Ford Escort in North Carolina which is
```

```
12  ;              composed of a 5 VDC regulator, the microcomputer (Intel 8251),
13  ;              a watch-dog timer, and clock and data line drivers. There are
14  ;              15 "A" chips used in the system as well as several AC and DC
15  ;              power driver modules.
16  ;           3-COLD_START_INITIALIZATION is the entry point on power-up or
17  ;              system reset which results from time-out of the "Watch-dog"
18  ;              circuit. The "Watch-dog" is constantly pulsed by the micro-
19  ;              computer under normal operation conditions every 1/2 to 1.25
20  ;              milli-seconds. This is also the entry point after system test.
21  ;           4-WARM_START is the entry point after every complete pass of the
22  ;              system; i.e. after all 15 "A" chips have been serviced and
23  ;              processed.
24  ; LIMITATIONS: None
25  ; RESTRICTIONS: 1-The "Watch-dog timer must be pulsed at least every 2 milli-
26  ;              seconds to insure that the system is not Reset.
27  ; ACCURACY REQUIREMENTS: 1-The timing of all routines and timers assumes that
28  ;              a 12.00 MHz clock crystal is used. This produces
29  ;              a 1 microsecond instruction cycle time. Most
30  ;              instructions execute in 1 usec, but no instruction
31  ;              used in this project requires more than 2 usec to
32  ;              execute.
33  ; METHODS USED: 1-The heart of the control sequence is determined by the code
34  ;              which starts at BEGIN_MAIN_EXECUTIVE. This is basically an
35  ;              ordered collection of subroutine calls. After all the calls,
36  ;              an output port pin on the micro is pulsed to indicate that
37  ;              the processing of the returned data from the "A" chips is
38  ;              finished. At this point the software waits until the 320
39  ;              microsecond timer is finished and then starts over.
40  ;           2-This routine includes a Test section which is entered only if
41  ;              the Copier count is "F" (# key) at the same time that the
42  ;              # key is touched on the Security System Keypad. The test
43  ;              routine activates all loads, one at a time, for 1/2 second
44  ;              intervals.
45  ; ALGORITHM DEFINITIONS: None
46  ; PRE-REQUISITES: 1-The RAM has been conditionally tested; i.e. if any 1 of
47  ;              the four memory locations does not have the proper data
48  ;              in it, the RAM is completely tested and filled.
49  ; INPUTS:
50  ;   -I/O; P2.3(H_S_S_F)
51  ;   -REGISTERS; Bank 0 Reg. 6
52  ;   -MAILBOXES; None
53  ;   -FLAGS; PSW.1,PSW.5,TF1
54  ; OUTPUTS:
55  ;   -I/O; P2,P2.3,P3,P3.6
56  ;   -REGISTERS; TL0;TL1;TH0;TH1;B;PSW;SCON;IP;IE;TMOD;TCON;SP;Bank 0
57  ;              Registers 0,2,5,6; Bank 1 Reg. 0,2,3; Bank 2 Reg. 0,2,3,7;
58  ;              Bank 3, Reg. 3,4; 21H-2FH;
59  ;   -MAILBOXES; 40H
60  ;   -FLAGS; 2C.2,2C.6,B.6,
61  ; REGISTERS USED: ACC,
62  ; MAXIMUM STACK DEPTH: 6 (2 in this module ONLY)
63  ; OUTSIDE SUBROUTINES CALLED: 1-TRNSMT
64  ;                             2-TIMER
65  ;                             3-AUTO_SYSTEM
66  ;                             4-COPIER_SYSTEM
67  ;                             5-SECURITY_SYSTEM
68  ;                             6-WASHER
```

```
                        63  ;                           7-ENERGY_SYSTEM
                        70  ;                           8-ICSA
                        71  ; BRANCHING: See METHODS USED #2
                        72  ; TEST CRITERIA: None that are special.
                        73  ; INTERMODULE COMMUNICATION: None
                        74  ; ERROR EXITS: On Reset only (pin 9 of the 8051)
                        75  ;   TYPE:     Interrupt
                        76  ;   PROCEDURE: At location 0BH
                        77  ;
                        78  ; MODULE LENGTH: _B2H BYTES (178D)
                        79  ; MODULE EXECUTION TIME: CRYSTAL FREQ. ___12.00___MHZ
                        80  ;                        MINIMUM TIME; ___505.00___USEC
                        81  ;                        TYPICAL TIME; ___505.00___USEC
                        82  ;                        MAXIMUM TIME; ___650.00___USEC
                        83  ;
                        84  ;                        MIN EXECUTION CYCLES__1F9H_
                        85  ;                        MAX EXECUTION CYCLES__28AH_
                        86  ;
                        87  ;********************************************************************
                        88 +1 $EJ
                        89  NAME MAIN_EXECUTIVE
                        90  MAIN_EXEC SEGMENT CODE
                        91  RSEG MAIN_EXEC
                        92  EXTRN CODE (TRNSMT, TIMER, ICSA, SERVICE_TIMER0, AUTO_SYSTEM, COPIER_SYSTEM)
                        93  EXTRN CODE (SECURITY_SYSTEM, WASHER, ENERGY_SYSTEM)
                        94  EXTRN DATA (NMBR_COPY)
                        95  EXTRN BIT (FIRST_PASS_FLAG,START_COPIER_FLAG,SECURITY_LED,SYSTEM_ARMED)
                        96  PUBLIC COLD_START_INITIALIZATION, WARM_START,NMBR_A_CHIPS
                        97  ;
                        98  ;********************************************************************
                        99  ;                   8051 SUBSET DATA MEMORY MAP
                       100  ;====================================================================
                       101  ;                       BYTE
                       102  ;       NAME            ADDRESS             MODULE(S) WHERE USED
                       103  ;--------------------------------------------------------------------
000F                   104  NMBR_A_CHIPS            SET 15D    ;MAX USED IN THIS PROGRAM IS 7 "A" CHIPS
FFDC                   105  HSTL                    SET -36D   ;Half Second Timer0 Loop (also uses R7)
FF0B                   106  HSTH                    SET -245D  ;Total count=(245-1)x256+36=62,500 and
                       107                                     ; 62,500 X 8 = .500 second.
FF01                   108  TMTL                    SET -255D  ;Three Hundred Microsecond Timer1 Loop
FFFF                   109  TMTH                    SET -1D    ;Total count=(1-1)*256+255+45(from call's in
                       110                                     ; main executive and misc instructions)=300
                       111                                     ; usec.
002F                   112  TOP_BIT_MAP             SET 020H+NMBR_A_CHIPS  ;MAX=02FH
                       113  ;                       to
0021                   114  A_STRT_BIT_MAP          SET 021H ;
0020                   115  STRT_BIT_MAP            SET 020H ;
REG                    116  CNTR                    SET R5
REG                    117  COUNTER                 SET R2   ;Bank 1, Register 0AH
REG                    118  COPIER_COUNTER          SET R6   ;                          A V1.6
                       119  ;********************************************************************
                       120  ;               8051 SUBSET DATA MEMORY MAP - CONT'D
                       121  ;====================================================================
                       122  ;                       BIT
                       123  ;       NAME            ADDRESS             MODULE(S) WHERE USED
                       124  ;--------------------------------------------------------------------
00D5                   125  TEST_FLAG               BIT PSW.5 ;D5H
```

```
00D1              126      FINISHED_FLAG              BIT PSW.1    ;D1H
00F6              127      DIM_FLAG                   BIT B.6H     ;F6H
00A3              128      HALF_SECOND_STATUS_FLAG    BIT P2.3
00B6              129      END_PROCESS_PULSE          BIT P3.6     ;B6H
                  130 +1   $EJ
                  131      ;****************************************************************
                  132      ;#                                                              #
                  133      ;#                    START MAIN EXECUTIVE                      #
                  134      ;#                                                              #
                  135      ;****************************************************************
                  136      COLD_START_INITIALIZATION:        ;Starting point for initial power-up only!
0000 758ADC       137          MOV TL0,#HSTL                 ;Set-up for 62 msec interrupt service routine
0003 758C0B       138          MOV TH0,#HSTH                 ;Set-up for 62 msec interrupt service routine
0006 75F000       139          MOV B,#0H                     ;Clr DIM_FLAG,KPM_CMPLMNT_FLAG,ALARM,
                  140                                        ; KEY_SERVICED,KEY_SERVICED1,FIRST_PASS_FLAG,
                  141                                        ; START_COPIER_FLAG=.6 to .0
0009 75B0FF       142          MOV P3,#0FFH                  ;Set all flags=1 in P3
000C 75080F       143          MOV 08H,#0FH                  ;R0 now pointing to R7 in Bank 1
000F 7528FE       144          MOV 28H,#11111110B            ;Set-up for keypad scan
0012 752DFE       145          MOV 2DH,#11111110B            ;Set-up for keypad scan
0015 750B08       146          MOV 0BH,#08H                  ;Initial R3 of Bank 1 - Index Counter
0018 751308       147          MOV 13H,#08H                  ;Initial R3 of Bank 2 - Index Counter
001B 751BFF       148          MOV 1BH,#0FFH                 ;Initial R3 of Bank 3 - WASHER_SWS
001E 751C00       149          MOV 1CH,#00H                  ;Initial R4 of Bank 3 - WSHR_CNTR
0021 750A01       150          MOV 0AH,#1H                   ;Initial Counter value (R2 in Bank 1)
0024 751101       151          MOV 11H,#1H                   ;Initial Counter value (R2 in Bank 2)
0027 751053       152          MOV 10H,#53H                  ;INDEX_POINTER-R0, Bank 2
002A 751704       153          MOV 17H,#04D                  ;DIGIT_COUNTER-R7, Bank 2
002D 750000   F   154          MOV NMBR_COPY,#0H             ;Used in PROCESS_DATA Routine
0030 7E04         155          MOV COPIER_COUNTER,#04D       ;Used in PROCESS_DATA Routine
0032 7527AA       156          MOV 27H,#10101010B            ;Set Copier display device to "0"
0035 750564       157          MOV 05,#100D                  ;Set-up for CNTR(R5,Bnk 0) in PROCESS_DATA Routine
0038 C200     F   158          CLR SECURITY_LED              ;Beam LED in Security section = "ON"
003A D200     F   159          SETB SYSTEM_ARMED
003C D200         160          SETB 20H.0                    ;KEY_DECODED_NOT
                  161      ;(((((((((((((((((((((((((( MAIN LOOP ENTRY ))))))))))))))))))))))))))
                  162      WARM_START:
003E 75D020       163          MOV PSW,#00100000B            ;PSW Condition: Bank 0, TEST_FLAG & FINISHED_
                  164                                        ; FLAG=OFF (T_F=1, F_F=0)
0041 53980C       165          ANL SCON,#00001100B           ;Flags in TB8, RB8 not reset to "0" in SCON
0044 75B800       166          MOV IP,#00H                   ;All interrupts are low priority
0047 75A8E2       167          MOV IE,#11100010B             ;Note: In the TRANSMT routine, be sure to
                  168                                        ; disable interrupts and to enable the
                  169                                        ; transmit driver upon entering the routine.
                  170                                        ; Do opposite before exiting.
004A 758911       171          MOV TMOD,#11H                 ;Both Timers configured as 16 bit Counters
004D 758850       172          MOV TCON,#01010000B           ;Both Timers are now running
0050 758B01       173          MOV TL1,#TMTL
0053 758DFF       174          MOV TH1,#TMTH                 ;Timer 1 count now initialized
0056 75815F       175          MOV SP,#05FH                  ;Initialize Stack Pointer to start at 60H
0059 43B076       176          ORL P3,#076H                  ;All ports set to "1" except .7, .3, and .0
                  177                                        ; which remain unchanged
                  178      ;----------------------------------------
                  179      BEGIN_MAIN_EXECUTIVE:
005C 120000   F   180          CALL TRNSMT                   ;Transmit data to remote "A" chips
005F 120000   F   181          CALL TIMER                    ;Initiate 300 usec delay
0062 B2F6         182          CPL DIM_FLAG
```

```
0064 122000  F  183         CALL AUTO_SYSTEM
0067 120000  F  184         CALL COPIER_SYSTEM
006A 120000  F  185         CALL SECURITY_SYSTEM
006D 120000  F  186         CALL WASHER
0070 120000  F  187         CALL ENERGY_SYSTEM
0073 C2B6       188         CLR END_PROCESS_PULSE
0075 D2B6       189         SETB END_PROCESS_PULSE   ;Issue pulse indicating processing is complete
0077 308FFD     190         JNB TF1,$                ;Wait for end of 300 usec delay (shorter than
                191                                  ; 300 to accomodate for instructions in the
                192                                  ; main loop)
007A 30D502     193         JNB TEST_FLAG,TEST_ROUTINE ;If Test Flag bit is "ON", initiate test
007D 80BF       194         JMP WARM_START           ;Go to Top of Loop
                195 +1 $EJ
                196 ;##################################################################
                197 ;#                                                                #
                198 ;#                    START TEST EXECUTIVE                        #
                199 ;#                                                                #
                200 ;##################################################################
                201 ;
                202         TEST_ROUTINE:            ;Cycle every command "ON" for 1/2 second
007F 7820       203             MOV R0,#STRT_BIT_MAP
0081 74FF       204             MOV A,#0FFH
0083 7D01       205             MOV CNTR,#01H        ;Reset up-count in PROCESS_DATA subroutine
0085 F6         206         FBML: MOV @R0,A          ;Fill Bit Map Loop with "1"'s
0086 08         207             INC R0
0087 B830FB     208             CJNE R0,#TOP_BIT_MAP+1,FBML
                209 ;
                210 ;=======INITIALIZE==========
                211 ;
008A 7821       212             MOV R0,#A_STRT_BIT_MAP   ;Pre-requisite for ICSA routine
008C 7521BF     213             MOV A_STRT_BIT_MAP,#10111111B ;Pre-requisite for ICSA routine
008F 7A05       214             MOV R2,#05H          ;Pre-requisite for ICSA routine
0091 120000  F  215             CALL ICSA            ;Pre-requisite for ICSA routine
0094 75A000     216             MOV P2,#0D           ;This guarantees 1st lamp on for 1/2 sec
                217 ;
                218 ;((((((((((((((((((((((( MAIN TEST LOOP ENTRY )))))))))))))))))))))))))
                219 ;
                220         TEST_LOOP:               ;Transmit same data pattern for 1/2 second
0097 120000  F  221             CALL TRNSMT          ;Transmit data to remote "A" chips
009A 120000  F  222             CALL TIMER           ;Initiate 300 usec delay and issue Watchdog
                223                                  ; Pulse
009D 308FFD     224             JNB TF1,$            ;Wait for end of 300 usec delay (shorter than
                225                                  ; 300 to accomodate for instructions in the
                226                                  ; test loop)
00A0 7E0B       227             MOV R6,#11D
00A2 DEFE       228             DJNZ R6,$            ;Delay 24 usec - compensate for fewer
                229                                  ; instructions in test loop so that overall
                230                                  ; dead time between clock bursts is 300 usec.
00A4 30A3F0     231             JNB HALF_SECOND_STATUS_FLAG,TEST_LOOP ;If H_S_S_F=0, repeat loop
00A7 B2A3       232             CPL HALF_SECOND_STATUS_FLAG
00A9 120000  F  233             CALL ICSA            ;Increment to next Command!
00AC 3001E8     234             JNB FINISHED_FLAG,TEST_LOOP;If Last Command issued,return to main loop
00AF 020000  F  235             JMP COLD_START_INITIALIZATION
                236         END
```

XREF SYMBOL TABLE LISTING

| NAME | TYPE | VALUE | | ATTRIBUTES AND REFERENCES |
|---|---|---|---|---|
| A_STRT_BIT_MAP. . . . . . | NUMB | 0021H | A | 114# 212 213 |
| AUTO_SYSTEM . . . . . . . | C ADDR | ---- | EXT | 92# 183 |
| B . . . . . . . . . . . . | D ADDR | 00F0H | A | 127 139 |
| BEGIN_MAIN_EXECUTIVE. . . | C ADDR | 005CH | R | SEG=MAIN_EXEC 179# |
| CNTR. . . . . . . . . . . | REG | R5 | | 116# 205 |
| COLD_START_INITIALIZATION | C ADDR | 0000H | R PUB | SEG=MAIN_EXEC 96 136# 235 |
| COPIER_COUNTER. . . . . . | REG | R6 | | 118# 155 |
| COPIER_SYSTEM . . . . . . | C ADDR | ---- | EXT | 92# 184 |
| COUNTER . . . . . . . . . | REG | R2 | | 117# |
| DIM_FLAG. . . . . . . . . | B ADDR | 00F0H.6 | A | 127# 182 |
| END_PROCESS_PULSE . . . . | B ADDR | 00B0H.6 | A | 129# 188 189 |
| ENERGY_SYSTEM . . . . . . | C ADDR | ---- | EXT | 93# 187 |
| FBML. . . . . . . . . . . | C ADDR | 0085H | R | SEG=MAIN_EXEC 206# 208 |
| FINISHED_FLAG . . . . . . | B ADDR | 00D0H.1 | A | 126# 234 |
| FIRST_PASS_FLAG . . . . . | B ADDR | ---- | EXT | 95# |
| HALF_SECOND_STATUS_FLAG . | B ADDR | 00A0H.3 | A | 128# 231 232 |
| HSTH. . . . . . . . . . . | NUMB | FF0BH | A | 106# 138 |
| HSTL. . . . . . . . . . . | NUMB | FFDCH | A | 105# 137 |
| ICSA. . . . . . . . . . . | C ADDR | ---- | EXT | 92# 215 233 |
| IE. . . . . . . . . . . . | D ADDR | 00A8H | A | 167 |
| IP. . . . . . . . . . . . | D ADDR | 00B8H | A | 166 |
| MAIN_EXEC . . . . . . . . | C SEG | 00B2H | | REL=UNIT 90# 91 |
| MAIN_EXECUTIVE. . . . . . | ---- | ---- | | 89 |
| NMBR_A_CHIPS. . . . . . . | NUMB | 000FH | A PUB | 96 104# 112 |
| NMBR_COPY . . . . . . . . | D ADDR | ---- | EXT | 94# 154 |
| P2. . . . . . . . . . . . | D ADDR | 00A0H | A | 128 216 |
| P3. . . . . . . . . . . . | D ADDR | 00B0H | A | 129 142 176 |
| PSW . . . . . . . . . . . | D ADDR | 00D0H | A | 125 126 163 |
| SCON. . . . . . . . . . . | D ADDR | 0098H | A | 165 |
| SECURITY_LED. . . . . . . | B ADDR | ---- | EXT | 95# 158 |
| SECURITY_SYSTEM . . . . . | C ADDR | ---- | EXT | 93# 185 |
| SERVICE_TIMER0. . . . . . | C ADDR | ---- | EXT | 92# |
| SP. . . . . . . . . . . . | D ADDR | 0081H | A | 175 |
| START_COPIER_FLAG . . . . | B ADDR | ---- | EXT | 95# |
| STRT_BIT_MAP. . . . . . . | NUMB | 0020H | A | 115# 203 |
| SYSTEM_ARMED. . . . . . . | B ADDR | ---- | EXT | 95# 159 |
| TCON. . . . . . . . . . . | D ADDR | 0088H | A | 172 |
| TEST_FLAG . . . . . . . . | B ADDR | 00D3H.5 | A | 125# 193 |
| TEST_LOOP . . . . . . . . | C ADDR | 0097H | R | SEG=MAIN_EXEC 220# 231 234 |
| TEST_ROUTINE. . . . . . . | C ADDR | 007FH | R | SEG=MAIN_EXEC 193 222# |
| TF1 . . . . . . . . . . . | B ADDR | 0088H.7 | A | 190 224 |
| TH0 . . . . . . . . . . . | D ADDR | 008CH | A | 138 |
| TH1 . . . . . . . . . . . | D ADDR | 008DH | A | 174 |
| TIMER . . . . . . . . . . | C ADDR | ---- | EXT | 92# 181 222 |
| TL0 . . . . . . . . . . . | D ADDR | 008AH | A | 137 |
| TL1 . . . . . . . . . . . | D ADDR | 008BH | A | 173 |
| TMOD. . . . . . . . . . . | D ADDR | 0089H | A | 171 |
| TMTH. . . . . . . . . . . | NUMB | FFFFH | A | 109# 174 |
| TMTL. . . . . . . . . . . | NUMB | FF01H | A | 108# 173 |
| TOP_BIT_MAP . . . . . . . | NUMB | 002FH | A | 113# 208 |
| TRNSMT. . . . . . . . . . | C ADDR | ---- | EXT | 92# 180 221 |

| | | | | | |
|---|---|---|---|---|---|
| WARM_START. . . . . . . . | C ADDR | 003EH | R PUB | SEG=MAIN_EXEC | 96 162# 194 |
| WASHER. . . . . . . . . . | C ADDR | —— | EXT | | 93# 186 |

REGISTER BANK(S) USED: 0, TARGET MACHINE(S): 8051

ASSEMBLY COMPLETE, NO ERRORS FOUND

MCS-51 MACRO ASSEMBLER    TSTRN0 - Task demo System TRaNsmit V1.0                                           PAGE    1

ISIS-II MCS-51 MACRO ASSEMBLER V2.0
OBJECT MODULE PLACED IN :F0:TSTRN0.OBJ
ASSEMBLER INVOKED BY: ASM51 TSTRN0.SRC XREF PW(108) TT(TSTRN0-) DA() DB EP WF(:F1:) PR(:F1:TSTRN0.LST)

LOC  OBJ           LINE    SOURCE

```
               1     $TT(TSTRN0 - Task demo System TRaNsmit V1.0)
               2     ;****************************************************************
               3     ; ASSUMPTIONS: 1-The system contains up to 32 "A" chips. The exact number is
               4     ;                 determined by the paramater NMBR_A_CHIPS.
               5     ;              2-System format is alternating commands and responses. Logic
               6     ;                 is active low. The UART issues up to 32 data bursts of 8 bits
               7     ;                 each. Initially the UART issues command0(C0) followed by a "1"
               8     ;                 followed by C2, etc. During the "1" state, Port 3.4 is read
               9     ;                 which represents the response(R0) of the 1st "A" chip.
              10     ;              3-Up to 128 commands are sent in groups of 8 bits via the UART
              11     ;                 where the 8 bits are composed of alternating commands and
              12     ;                 "1"'s. These patterns are stored prior to transmission in
              13     ;                 internal RAM locations 50H to 6FH. There are 32 bytes where
              14     ;                 each byte contains 4 commands. Note: on systems with less
              15     ;                 than 17 "A" chips, patterns for transmission are stored in
              16     ;                 the Bit Memory located in the range of 20H to 2FH.
              17     ;              4-Responses are stored in internal RAM at 30H to 4FH. Only the
              18     ;                 high nibble of each byte contains desireable data.
              19     ;              5-The Data Line is tested after each data burst to determine
              20     ;                 if a short on the data line exists.
              21     ;              6-This routine sacrifices code space to maximize operating
              22     ;                 speed. The code is very repetitive; however, to make a
              23     ;                 loop would require additional testing after each UART data
              24     ;                 burst which would increase transmission interburst dead
              25     ;                 time. So as it is, the interburst dead time is 5 machine
              26     ;                 cycles.
              27     ;              7-If the data line becomes shorted during this routine, the
              28     ;                 test JNB P3.4,$ will cause the code to execute an endless
              29     ;                 loop at that instruction. However, the "Watchdog Timer" will
              30     ;                 cause a reset to code location 202H. This action will result
              31     ;                 in another loop at the start of the TRNSMT routine untill
              32     ;                 reset again. This process will continue until the short on
              33     ;                 the data line is cleared.
              34     ; LIMITATIONS: 1-No more than 32 "A" chips can be used-this is the maximum
              35     ;                 capacity.
              36     ; RESTRICTIONS: 1-Normally C0 of the 1st "A" chip and R4 of the last chip
              37     ;                 would not be used because of data security; however, in
              38     ;                 the enviornmental test routine, they will be used.
              39     ;              2-All interrupts MUST be disabled during UART transmission!
```

```
40  ;                   However, they are re-enabled in another routine.
41  ; ACCURACY REQUIREMENTS: 1-System speed is 1Mhz with a 12Mhz crystal.
42  ;                       2-System refresh time must be less than 1.75mSec.
43  ;                       3-In order to syncronize the sensing of the data
44  ;                         line under software control with the timing of the
45  ;                         UART, 2 instruction cycles must occur between the
46  ;                         starting of the UART and the read of the data line.
47  ;                         Additionally, 1 instruction cycle must occur between
48  ;                         each read of the data line.
49  ;                       4-Without checking the data line for a shorted
50  ;                         condition, the interburst dead time is limited to
51  ;                         3 instruction cycles(@ TXD=1Mhz, that is 3 uSec).
52  ; METHODS USED: 1-The typical transmit cell consists of:
53  ;                  A-Start UART by moving a command burst into SBUF from
54  ;                    the area of 50H to 6FH (20H to 2FH on small systems).
55  ;                  B-Move the data collected in the accumulator from the
56  ;                    previous burst (which is the accumulation of all the
57  ;                    desired responses) into RAM storage area 30H to 4FH.
58  ;                  c-Move P3.4 into the "C" register and then rotate it
59  ;                    into the accumulator. Do this 4 times.
60  ; ALGORITHM DEFINITIONS: None
61  ; PRE-REQUISITES: 1-The UART has been previously configured for Mode 0 and the
62  ;                   associated Timer also properly configured.
63  ;                 2-The number of clock and data bursts is determined by the
64  ;                   parameter NUMBER_A_CHIPS.
65  ; INPUTS:
66  ;   -I/O; P3.4=Input Data from DATA LINE.
67  ;   -REGISTERS; None
68  ;   -MAILBOXES; None
69  ;   -FLAGS; None
70  ;   -OTHER MODULES:
71  ;     -I/O; None
72  ;     -REGISTERS; None
73  ;     -MAILBOXES; None
74  ;     -FLAGS; None
75  ;   -OTHER SUBROUTINES:
76  ;     -I/O; None
77  ;     -REGISTERS; None
78  ;     -MAILBOXES; None
79  ;     -FLAGS; None
80  ; OUTPUTS:
81  ;   -I/O; P3.0(RXD) and P3.1(TXD) are Data and Clock respectively under
82  ;         control of the UART; P3.5(BH.5)-TASK_DISABLE_NL_H_EQ_DSBL;
83  ;         P3.2(BH.2)-WATCHDOG
84  ;   -REGISTERS; 20H to 2FH=Command Storage Area; 30H to 3FH=Response Storage
85  ;               area
86  ;   -MAILBOXES; None
87  ;   -FLAGS; EA(AFH)
88  ;   -OTHER MODULES:
89  ;     -I/O; None
90  ;     -REGISTERS; None
91  ;     -MAILBOXES; None
92  ;     -FLAGS; None
93  ;   -OTHER SUBROUTINES:
94  ;     -I/O; None
95  ;     -REGISTERS; None
96  ;     -MAILBOXES; None
```

```
 97    ;   -FLAGS; None
 98    ; REGISTERS USED: ACC, C, P3.0, P3.1, P3.2, P3.4, P3.5, 22H-2FH, 30H-3FH, EA
 99    ; MAXIMUM STACK DEPTH: 0
100    ; OUTSIDE SUBROUTINES CALLED: None
101    ; BRANCHING: None
102    ; EXTERNAL LABELS: None
103    ; TEST CRITERIA: Test all functional aspects of this module with the EMV51
104    ;                Emulation Vehicle.
105    ; INTERMODULE COMMUNICATION: None
106    ; ERROR EXITS: None
107    ;   TYPE;
108    ;   PROCEDURE;
109    ;
110    ; MODULE LENGTH: _14EH;  _334Dec BYTES
111    ; MODULE EXECUTION TIME:
112    ;     CRYSTAL FREQ. ___12.00___MHZ
113    ;     MINIMUM TIME; __202.00___USEC
114    ;     TYPICAL TIME; __202.00___USEC
115    ;     MAXIMUM TIME; _Infinite__USEC
116    ;
117    ;     MIN EXECUTION CYCLES; _CAH;  __202Dec
118    ;     TYP EXECUTION CYCLES; _CAH;  __202Dec
119    ;     MAX EXECUTION CYCLES; Inf H;  Inf _Dec
120    ;
121    ;**********************************************************************
122 +1 $EJ
123    NAME TRANSMIT_ROUTINE
124    TRANSMIT SEGMENT CODE
125    RSEG TRANSMIT
126    EXTRN NUMBER (NMBR_A_CHIPS)
127    PUBLIC TRNSMT
128    ;**********************************************************************
129    ;                 8051 SUBSET DATA MEMORY MAP
130    ;======================================================================
131    ;                      BYTE
132    ;   NAME               ADDRESS           MODULE(S) WHERE USED
133    ;----------------------------------------------------------------------
134    ;SET(NUMBER_A_CHIPS,6) ;Used in TRNSMT:16=# "A" chips in system-Max=16(0-15)
135 +2
136    ;TOP_RSP_S_A           SET 030H+NMBR_A_CHIPS  ;MAX=04FH
137    ;                      to
138    STRT_RSP_S_A          SET 030H  ;
139    ;**********************************************************************
140    ;
141    ;**********************************************************************
142    ;              8051 SUBSET DATA MEMORY MAP - CONT'D
143    ;======================================================================
144    ;                      BIT
145    ;   NAME               ADDRESS           MODULE(S) WHERE USED
146    ;----------------------------------------------------------------------
147    TASK_DISABLE_NL_H_EQ_DSBL  BIT P3.5  ;B5H
148    INPUT_DATA                 BIT P3.4  ;B4H
149    WATCHDOG                   BIT P3.2  ;B2H
150    ;**********************************************************************
151 +1 $EJ
```

```
                    152  TRNSMT:
0000 C2AF           153        CLR EA                ;Global interrupt disable prior to UART transmission
0002 C2B5           154        CLR TASK_DISABLE_NL_H_EQ_DSBL   ;Enable TASK transmissions. If used,
                    155                              ; this port disables TASK transmissions during the
                    156                              ; processing of returned data. Thus, TXD and RXD can
                    157                              ; be used for other purposes (i.e. I/O expansion).
0004 30B4FD         158        JNB P3.4,$            ;Test Data Line; if low, wait here until it is high
                    159  Transmit_Burst_0:
0007 852099         160        MOV SBUF,20H          ;Start of Command Storage area-UART Now started
000A C2B2           161        CLR WATCHDOG          ;Needed to synchronize Port 3.4 read timing with UART
                    162                              ; timing and provide Watchdog timer pulse servicing
000C D2B2           163        SETB WATCHDOG         ;Needed to synchronize Port 3.4 read timing with UART
                    164                              ; timing and provide Watchdog timer pulse servicing
000E A2B4           165        MOV C,P3.4            ;Read R0 of burst 0
0010 13             166        RRC A                 ;Put the value of R0 into ACC bit 7
0011 A2B4           167        MOV C,P3.4            ;Read R1 of burst 0
0013 13             168        RRC A                 ;Put the value of R1 into ACC bit 7
0014 A2B4           169        MOV C,P3.4            ;Read R2 of burst 0
0016 13             170        RRC A                 ;Put the value of R2 into ACC bit 7
0017 A2B4           171        MOV C,P3.4            ;Read R3 of burst 0
0019 30B4FD         172        JNB P3.4,$            ;Test Data Line; if low, wait here until it is high
                    173  Transmit_Burst_1:
001C 852199         174        MOV SBUF,21H          ;Command Storage area-UART Now started
001F 13             175        RRC A                 ;Put the value of R3 of Burst 0 into ACC bit 7
0020 F530           176        MOV 30H,A             ;Start of Response Storage Area-Responses of "A0" now
                    177                              ; in RAM
0022 A2B4           178        MOV C,P3.4            ;Read R0 of burst 1
0024 13             179        RRC A                 ;Put the value of R0 into ACC bit 7
0025 A2B4           180        MOV C,P3.4            ;Read R1 of burst 1
0027 13             181        RRC A                 ;Put the value of R1 into ACC bit 7
0028 A2B4           182        MOV C,P3.4            ;Read R2 of burst 1
002A 13             183        RRC A                 ;Put the value of R2 into ACC bit 7
002B A2B4           184        MOV C,P3.4            ;Read R3 of burst 1
002D 30B4FD         185        JNB P3.4,$            ;Test Data Line; if low, wait here until it is high
                    186 +1 $NOGEN
                    187  ;---The following Def... is a macro definition---
                    188  %*Define(TRANSMIT_X(CNT,CSA,RSA,CNT_MNS_1))(
                             %IF(%CNT GT %NUMBER_A_CHIPS)THEN(%EXIT)FI
                         Transmit_Burst_%CNT:
                               MOV SBUF,%CSA         ;Command Storage Area-UART Now started
                               RRC A                 ;Put the value of R3 into ACC bit 7
                               MOV %RSA,A            ;Rspnse Storage Area-Responses of "A%CNT_MNS_1" in RAM
                               MOV C,P3.4            ;Read R0 of burst %CNT
                               RRC A                 ;Put the value of R0 into ACC bit 7
                               MOV C,P3.4            ;Read R1 of burst %CNT
                               RRC A                 ;Put the value of R1 into ACC bit 7
                               MOV C,P3.4            ;Read R2 of burst %CNT
                               RRC A                 ;Put the value of R2 into ACC bit 7
                               MOV C,P3.4            ;Read R3 of burst %CNT
                               JNB P3.4,$            ;Test Data Line; if low, wait here until it is high
                         )
                    189  ;---The following TRAN... is a macro expansion---
                    190  %TRANSMIT_X(2,22H,31H,1)
                    205  %TRANSMIT_X(3,23H,32H,2)
                    220  %TRANSMIT_X(4,24H,33H,3)
```

```
                    235         %TRANSMIT_X(5,25H,34H,4)
                    250         %TRANSMIT_X(6,26H,35H,5)
                    265         %TRANSMIT_X(7,27H,36H,6)
                    280         %TRANSMIT_X(8,28H,37H,7)
                    295         %TRANSMIT_X(9,29H,38H,8)
                    310         %TRANSMIT_X(10,2AH,39H,9)
                    325         %TRANSMIT_X(11,2BH,3AH,10)
                    340         %TRANSMIT_X(12,2CH,3BH,11)
                    355         %TRANSMIT_X(13,2DH,3CH,12)
                    370         %TRANSMIT_X(14,2EH,3DH,13)
                    385         %TRANSMIT_X(15,2FH,3EH,14)
                    400         $GO
0148 13             401         RRC A                          ;Put the value of R3 into ACC bit 7
0149 F500    F      402         MOV STRT_RSP_S_A+NMBR_A_CHIPS,A ;Top of Response Storage area
014B D2B5           403         SETB TASK_DISABLE_NL_H_EQ_DSBL  ;Disable TASK transmissions
014D 22             404         RET                            ;Return from this subroutine
                    405         END
```

XREF SYMBOL TABLE LISTING

| NAME | TYPE | VALUE | ATTRIBUTES AND REFERENCES |
|---|---|---|---|
| EA. . . . . . . . . . . . | B ADDR | 00A8H.7 A | 153 |
| INPUT_DATA. . . . . . . . | B ADDR | 00B0H.4 A | 148# |
| NMBR_A_CHIPS. . . . . . . | NUMB | —— EXT | 126# 402 |
| P3. . . . . . . . . . . | D ADDR | 00B0H  A | 147 148 149 158 165 167 169 171 172 178 180 182 184 |
| | | | 185 196 198 200 202 203 211 213 215 217 218 226 228 |
| | | | 230 232 233 241 243 245 247 248 256 258 260 262 263 |
| | | | 271 273 275 277 278 286 288 290 292 293 301 303 305 |
| | | | 307 308 316 318 320 322 323 331 333 335 337 338 346 |
| | | | 348 350 352 353 361 363 365 367 368 376 378 380 382 |
| | | | 383 391 393 395 397 398 |
| SBUF. . . . . . . . . . | D ADDR | 0099H  A | 160 174 193 208 223 238 253 268 283 298 313 328 343 |
| | | | 358 373 388 |
| STRT_RSP_S_A. . . . . . . | NUMB | 0030H  A | 138# 402 |
| TASK_DISABLE_NL_H_EQ_DSBL | B ADDR | 00B0H.5 A | 147# 154 403 |
| TRANSMIT_BURST_0. . . . . | C ADDR | 0007H  R | SEG=TRANSMIT 159# |
| TRANSMIT_BURST_1. . . . . | C ADDR | 001CH  R | SEG=TRANSMIT 173# |
| TRANSMIT_BURST_10 . . . . | C ADDR | 00D0H  R | SEG=TRANSMIT 312# |
| TRANSMIT_BURST_11 . . . . | C ADDR | 00E4H  R | SEG=TRANSMIT 327# |
| TRANSMIT_BURST_12 . . . . | C ADDR | 00F8H  R | SEG=TRANSMIT 342# |
| TRANSMIT_BURST_13 . . . . | C ADDR | 010CH  R | SEG=TRANSMIT 357# |
| TRANSMIT_BURST_14 . . . . | C ADDR | 0120H  R | SEG=TRANSMIT 372# |
| TRANSMIT_BURST_15 . . . . | C ADDR | 0134H  R | SEG=TRANSMIT 387# |
| TRANSMIT_BURST_2. . . . . | C ADDR | 0030H  R | SEG=TRANSMIT 192# |
| TRANSMIT_BURST_3. . . . . | C ADDR | 0044H  R | SEG=TRANSMIT 207# |
| TRANSMIT_BURST_4. . . . . | C ADDR | 0058H  R | SEG=TRANSMIT 222# |
| TRANSMIT_BURST_5. . . . . | C ADDR | 006CH  R | SEG=TRANSMIT 237# |
| TRANSMIT_BURST_6. . . . . | C ADDR | 0080H  R | SEG=TRANSMIT 252# |
| TRANSMIT_BURST_7. . . . . | C ADDR | 0094H  R | SEG=TRANSMIT 267# |
| TRANSMIT_BURST_8. . . . . | C ADDR | 00A8H  R | SEG=TRANSMIT 282# |
| TRANSMIT_BURST_9. . . . . | C ADDR | 00BCH  R | SEG=TRANSMIT 297# |
| TRANSMIT_ROUTINE. . . . . | —— | —— | 123 |
| TRANSMIT. . . . . . . . . | C SEG | 014EH | REL=UNIT 124# 125 |
| TRNSMT. . . . . . . . . . | C ADDR | 0000H  R PUB | SEG=TRANSMIT 127 152# |
| WATCHDOG. . . . . . . . . | B ADDR | 00B0H.2 A | 149# 161 163 |

REGISTER BANK(S) USED: 0, TARGET MACHINE(S): 8051

ASSEMBLY COMPLETE, NO ERRORS FOUND

APPENDIX

MCS-51 MACRO ASSEMBLER    TSSRK1 - Task System SeRvice Keypad V1.1                                PAGE  1

ISIS-II MCS-51 MACRO ASSEMBLER V2.0
OBJECT MODULE PLACED IN :F0:TSSRK1.OBJ
ASSEMBLER INVOKED BY: ASM51 TSSRK1.SRC XREF PW(108) TT(TSSRK1-) DA() DB EP WF(:F1:) PR(:F1:TSSRK1.LST)

```
LOC  OBJ          LINE    SOURCE

1      $TT(TSSRK1 - Task System SeRvice Keypad V1.1)
                   2      ;**********************************************************************
                   3      ; ASSUMPTIONS: 1-Routine runs under TMMEP0.SRC or later which services 16 "A"
                   4      ;                 chips.
                   5      ;              2-Keypad is connected to an "A" chip with Row 1 to Row 4 of the
                   6      ;                 keypad connected to C0 to C3 respectively. Also Column 1 to
                   7      ;                 Column 4 of the Keypad is connected to R0 to R3 respectively.
                   8      ;              3-Bank 2 is used for all tempory register manipulations. R4
                   9      ;                 contains the temoory location of column activation for keypad
                  10      ;                 rows 1 thru 4 respectively. R1 contains the number of the row
                  11      ;                 that was activated (row 1 to 4) which is used for calculation
                  12      ;                 purposes in another routine. However, the row number is X 2.
                  13      ;              4-A key must be held down for ) 80 msec to be considered a valid
                  14      ;                 activation.
                  15      ;              5-With a 16 "A" Chip system, the keypad is scanned every 4
                  16      ;                 msec which correspondes to 8 passes of the entire system. On
                  17      ;                 the first pass of the system, the first row is set low(C0). On
                  18      ;                 the second pass the "A" chip is read and tested. A low on any
                  19      ;                 response (R0 to R3) indicates that a key in the first row was
                  20      ;                 depressed. On the third pass the second row is driven low(C1).
                  21      ;                 On the fourth pass, the responses are again read, etc. This
                  22      ;                 process continues until the 8th pass is finished at which time
                  23      ;                 the returned and collected data is decoded.
                  24      ;              6-This routine is called from another subroutine.
                  25      ;              7-Since Response inputs have pull-up resistors, a "1" is
                  26      ;                 normally read into the TASK system as long as no key was
                  27      ;                 depressed. Note that the TASK arcitecture is negative true.
                  28      ;                 A "0" is applied to one row (Command Output) at a time and if
                  29      ;                 a key is depressed that "0" will appear on the appropriate
                  30      ;                 column (Response Input) as it is scanned.
                  31      ;              8-All internal program flags are positive true, e.g. Key_Dep.
                  32      ;              9-This routine only services the "A" chip to which a keypad is
                  33      ;                 connected; another routine is responsible for "Debouncing"
                  34      ;                 and "Decoding" the key that was depressed.
                  35      ; LIMITATIONS: 1-Any momentary power outage will turn off all loads because
                  36      ;                 inputs from the keyboard are only momentary. Thus, they must
                  37      ;                 be stored in memory and if the power fails, the status of the
                  38      ;                 memory is lost. The only way around this problem is to
                  39      ;                 provide back-up battery power to the 8051's RAM memory.
                  40      ; RESTRICTIONS: 1-This routine requires a 12 Mhz clock for the selected
                  41      ;                 counts that are used.
                  42      ; ACCURACY REQUIREMENTS: None
```

```
43   ; METHODS USED: 1-Verify that the PASS_CNTR is in the range of 0 to 8. If it is
44   ;                  not reset all applicable registers to their starting values.
45   ;               2-On odd counts of PASS_CNTR, test for key depressions on the
46   ;                  currently scanned row. If the count is even, make no tests.
47   ;               3-If data exists, mask it and store it in R4. Also store the
48   ;                  row number being scanned in R1 (This will be times 2).
49   ;                  However, only store the data if it is the first time that
50   ;                  the key has been depressed. Also set the flag KEY_DEP1. This
51   ;                  action permits the beginning of contact "Debouncing" in
52   ;                  another routine.This flag is always cleared in the other
53   ;                  routine on every pass of system.
54   ;               4-Alter the KEY_CMND_REG to prepare for the driving of the
55   ;                  next row whenever the PASS_CNTR is odd.
56   ;               5-Whenever PASS_CNTR is zero, reset all pertinent registers
57   ;                  to their initial values.
58   ; ALGORITHM DEFINITIONS: None
59   ; PRE-REQUISITES: 1-During Cold-Start the following registers must be properly
60   ;                    set-up: 2DH=11111110B; R3(13H)=8H; R2(12H)=1H
61   ; INPUTS:
62   ;   -I/O; None
63   ;   -REGISTERS; 3DH - Returned "A" chip responses from device #13; 2DH - KEY_
64   ;                 CMND_REG
65   ;   -MAILBOXES; INTGRTN_CNTR(R2, Bank 2)
66   ;   -FLAGS; None
67   ; OUTPUTS:
68   ;   -I/O; None
69   ;   -REGISTERS; None
70   ;   -MAILBOXES; KEY_COL_DATA(14H - R4, Bank2); KEY_ROW_POINTER(11H - R1,Bank 2)
71   ;   -FLAGS; KEY_DEP1(BH.7),KEY_SERVICED1(BH.2),RS0,RS1
72   ; REGISTERS USED: R3(Bank 2), ACC
73   ; MAXIMUM STACK DEPTH: 2
74   ; SUBROUTINES CALLED: DCDKPD1 - Decode Keypad
75   ; BRANCHING: None other than subroutine
76   ; TEST CRITERIA: Test all functional aspects of this module with the EMV51
77   ;                  Emulation Vehicle.
78   ; ERROR EXITS: None
79   ;
80   ; MODULE LENGTH: __45H BYTES (69 DEC.)
81   ; MODULE EXECUTION TIME: CRYSTAL FREQ. ____12.00____MHZ
82   ;                         MINIMUM TIME; ____26.00____USEC
83   ;                         TYPICAL TIME; ____26.00____USEC
84   ;                         MAXIMUM TIME; ____45.00+___USEC + DCDKPD1
85   ;
86   ;                         MIN EXECUTION CYCLES__1AH__
87   ;                         MAX EXECUTION CYCLES__2DH + DCDKPD1
88   ;*****************************************************************
89 +1 $EJ
90   ;*****************************************************************
91   NAME SERVICE_KEYPAD_DATA1
92   S_K_D1 SEGMENT CODE
93   RSEG S_K_D1
94   EXTRN CODE (DCDKPD1)
95   EXTRN BIT (KEY_SERVICED1)
96   PUBLIC SRVKPD1,KEY_DEP1
97   USING 2
98   ;*****************************************************************
99   ;                   8051 SUBSET DATA MEMORY MAP
```

```
              100    ;================================================================
              101    ;                        BYTE
              102    ;    NAME              ADDRESS              MODULE(S) WHERE USED
              103    ;----------------------------------------------------------------
0014          104    KEY_COL_DATA          DATA 14H             ;Bank 2, R4 ;Used in SRVKPD routine
REG           105    PASS_CNTR             SET R3
REG           106    INTGRTN_CNTR          SET R2               ;Bank 2, Register 12H
0011          107    KEY_ROW_POINTER       DATA 11H             ;Bank 2, R1
003D          108    KEY_RESP_REG          SET 3DH              ;
002D          109    KEY_CMND_REG          SET 2DH              ;
              110    ;****************************************************************
              111    ;              8051 SUBSET DATA MEMORY MAP - CONT'D
              112    ;================================================================
              113    ;                        BIT
              114    ;    NAME              ADDRESS              MODULE(S) WHERE USED
              115    ;----------------------------------------------------------------
00F7          116    KEY_DEP1              BIT B.7   ;F7H
              117    ;****************************************************************
              118 +1 $EJ
              119    SRVKPD1:
0000 D2D4     120         SETB RS1                     ;Select Bank 2
0002 C2D3     121         CLR  RS0                     ;Insure ONLY Bank 2 is selected
0004 BB0900   122         CJNE PASS_CNTR,#9H,$+3       ;Set-up for test of "C" Reg
0007 400B     123         JC   LOAD                    ;If PASS_CNTR<9, jump
0009 7B08     124         MOV  PASS_CNTR,#8H           ;If PASS_CNTR>9, set PASS_CNTR=8 because it is
              125                                      ; out of range, also reset the following
              126                                      ; parameters: NOTE-8 passes must be made, the
              127                                      ; 8th to set all "A" chip cmnd outputs to "1"
000B 752DFE   128         MOV  2DH,#11111110B
000E 7A01     129         MOV  R2,#01H
0010 C200  F  130         CLR  KEY_SERVICED1
0012 C2F7     131         CLR  KEY_DEP1
              132    LOAD:
0014 EB       133         MOV  A,PASS_CNTR             ;Test for even count in PASS_CNTR; skip decode
              134                                      ; if even
0015 13       135         RRC  A                       ;Least significant bit now in "C" register
0016 501F     136         JNC  DPC                     ;If even jump-if odd decode potential data
0018 E53D     137         MOV  A,KEY_RESP_REG
001A 440F     138         ORL  A,#0FH                  ;Set Lo Byte="1111"
001C B4FF00   139         CJNE A,#0FFH,$+3             ;Set-up for test of "C" Reg.
001F 5010     140         JNC  SHIFT_XMIT              ;If A=FF, no key depressed - jump
0021 BA0104   141         CJNE INTGRTN_CNTR,#1D,K_D    ;Sample the data only when the count = 1
0024 F514     142         MOV  KEY_COL_DATA,A
0026 8B11     143         MOV  KEY_ROW_POINTER,PASS_CNTR
              144    K_D:
0028 B51406   145         CJNE A,KEY_COL_DATA,SHIFT_XMIT ;If not same key INTGRTN_CNTR will be
              146                                      ; decremented in another routine
002B EB       147         MOV  A,PASS_CNTR
002C B51102   148         CJNE A,KEY_ROW_POINTER,SHIFT_XMIT;If not same row, INTGRTN_CNTR will
              149                                      ; be decremented in another routine
002F D2F7     150         SETB KEY_DEP1                ;Set Flag KEY_DEP1=1 only if the same key
              151                                      ; was depressed
              152    SHIFT_XMIT:
0031 E52D     153         MOV  A,KEY_CMND_REG          ;Rotate the bit pattern in K_C_R, 2 positions
              154                                      ; to the left and restore it. This prepares
0033 23       155         RL   A                       ; the byte to be sent to the "A" chip connected
0034 23       156         RL   A                       ; to the keypad to extinguish the drive to the
```

```
0035 F52D         157            MOV  KEY_CMND_REG,A    ; current row and set-up to drive the next row.
                  158     DPC:
0037 DB08         159            DJNZ PASS_CNTR,CONT    ;In 8 passes store any key depression data in
                  160                                   ; R1, R4 and on 8th pass decode and start over
0039 7B08         161            MOV  PASS_CNTR,#8H     ;Restore counter to 8
003B 752DFE       162            MOV  KEY_CMND_REG,#11111110B   ;Restore starting Command Pattern
003E 120000   F   163            CALL DCDKPD1           ;Call DeCoDe KeyPaD subroutine
                  164     CONT:
0041 C2D3         165            CLR  RS0               ;Reset Bank Switch to Bank 0
0043 C2D4         166            CLR  RS1
0045 22           167            RET
                  168     END
```

XREF SYMBOL TABLE LISTING
---- ------ ----- -------

| N A M E | T Y P E | V A L U E | | ATTRIBUTES AND REFERENCES |
|---|---|---|---|---|
| B. . . . . . . . . . . | D ADDR | 00F0H | A | 116 |
| CONT . . . . . . . . | C ADDR | 0041H | R | SEG=S_K_D1  159 164# |
| DCDKPD1. . . . . . | C ADDR | ---- | EXT | 94# 163 |
| DPC. . . . . . . . . | C ADDR | 0037H | R | SEG=S_K_D1  136 158# |
| INTGRTN_CNTR . . . . | REG | R2 | | 106# 141 |
| K_D. . . . . . . . . | C ADDR | 0028H | R | SEG=S_K_D1  141 144# |
| KEY_CMND_REG . . . . | NUMB | 002DH | A | 109# 153 157 162 |
| KEY_COL_DATA . . . . | D ADDR | 0014H | A | 104# 142 145 |
| KEY_DEP1 . . . . . . | B ADDR | 00F0H.7 A PUB | | 96 116# 131 150 |
| KEY_RESP_REG . . . . | NUMB | 003DH | A | 108# 137 |
| KEY_ROW_POINTER. . . | D ADDR | 0011H | A | 107# 143 148 |
| KEY_SERVICED1. . . . | B ADDR | ---- | EXT | 95# 130 |
| LOAD . . . . . . . . | C ADDR | 0014H | R | SEG=S_K_D1  123 132# |
| PASS_CNTR. . . . . . | REG | R3 | | 105# 122 124 133 143 147 159 161 |
| RS0. . . . . . . . . | B ADDR | 00D0H.3 A | | 121 165 |
| RS1. . . . . . . . . | B ADDR | 00D0H.4 A | | 120 166 |
| S_K_D1 . . . . . . . | C SEG | 0046H | | REL=UNIT 92# 93 |
| SERVICE_KEYPAD_DATA1 | ---- | ---- | | 91 |
| SHIFT_XMIT . . . . . | C ADDR | 0031H | R | SEG=S_K_D1  140 145 148 152# |
| SRVKPD1. . . . . . . | C ADDR | 0000H | R PUB | SEG=S_K_D1  96 119# |

REGISTER BANK(S) USED: 0 2, TARGET MACHINE(S): 8051

ASSEMBLY COMPLETE, NO ERRORS FOUND

APPENDIX 5

MCS-51 MACRO ASSEMBLER    TSDK10 - Task System Decode Keypad 1 V1.0                              PAGE  1

ISIS-II MCS-51 MACRO ASSEMBLER V2.0
OBJECT MODULE PLACED IN :F0:TSDK10.OBJ
ASSEMBLER INVOKED BY: ASM51 TSDK10.SRC XREF PW(108) TT(TSDK10-) DA() DB EP WF(:F1:) PR(:F1:TSDK10.LST)

LOC  OBJ            LINE    SOURCE

1       $TT(TSDK10 - Task System Decode Keypad 1 V1.0)

```
  2   ;************************************************************************
  3   ; ASSUMPTIONS: 1-This routine is part of the software to run the TASK Marketing
  4   ;                Demo Board. The main executive is called TMMEP1 - Task
  5   ;                Marketing Main Executive Program V1.0 and services 16
  6   ;                "A" chips.
  7   ;              2-The routine PTSRK1 has already been executed. Thus the flag
  8   ;                KEY_DEP1 has been serviced. This flag indicates whether any
  9   ;                keys have been detected as being depressed in another routine.
 10   ;              3-The TMTRN0 routine has previously transmitted data information
 11   ;                to and from the "A" chip to which the keypad is attached.
 12   ;              4-It takes approximately 4 milliseconds to service the keypad.
 13   ;                This represents 8 complete cycles of the TASK system.
 14   ;              5-Keypad debouncing is accomplished by starting an up-counter
 15   ;                whenever a valid key depression is observed. That up-count
 16   ;                proceeds to 20 unless the key is no longer depressed. That
 17   ;                would result from spurious noise or contact bouncing. When-
 18   ;                ever that occurs, the counter decrements until the same key
 19   ;                depression is observed. When and if the count eventually
 20   ;                reaches 20, the key is decoded. This technique amounts to
 21   ;                an intergation of contact closure with time and results in the
 22   ;                best possible debouncing in a noisy environment.
 23   ;              6-This routine uses Register Bank 2 exclusively.
 24   ;              7-This routine is a subroutine conditionally called by the
 25   ;                routine PTSRK1. It is called on every 8th pass of the system
 26   ;                and is always executed no mater whether any key is depressed
 27   ;                continuously or not depressed at all.
 28   ;              8-When a key is finally decoded, the flag KEY_SERVICED1 is
 29   ;                set = "1".
 30   ;              9-The decoded key value is placed into the accumulator at the
 31   ;                time that a return from this routine is executed.
 32   ; LIMITATIONS: 1-An up-count of 20 requires a total of 160 consecutive passes
 33   ;                of the system with the same key depressed (no noise or
 34   ;                contact bounce). Thus at least 80 milliseconds is required
 35   ;                to properly decode a key depression.
 36   ; RESTRICTIONS: 1-The flag KEY_DEP1 is always reset to "0" in this routine.
 37   ; ACCURACY REQUIREMENTS: 1-The system requires a 12 MHz clock oscillator and
 38   ;                services 16 "A" chips. Thus 1 complete system
 39   ;                cycle requires 202 usec (data transmission time to
 40   ;                16 "A" chips) + 300 usec (processing time) =502 usec
 41   ;                or approximately 1/2 millisecond.
 42   ; METHODS USED: 1-Determine if the same key has been depressed from the
 43   ;                previous key service cycle (8 passes of the system). The
 44   ;                byte, INTSRTN_CNTR, is incremented on each pass of the key
 45   ;                service cycle as long as the same key is sensed as being
 46   ;                depressed; otherwise the counter is decremented.
 47   ;              2-When the same key has been depressed for 20 key service
 48   ;                cycles, decode the key.
 49   ;              3-Decoding is accomplished by calculating the key number from
 50   ;                the row and column data and jumping to a look-up table.
 51   ; ALGORITHM DEFINITIONS: 1-Key calculation is accomplished as follows:
 52   ;                A-Divide the KEY_ROW_POINTER by 2; new range:0-3
 53   ;                B-Multiply the result by 9.
 54   ;                C-Add the KEY_COL_DATA to the result after altering.
 55   ;                D-Key Index = 9 X Row + Column.
 56   ;                E-Obtain key code from Table. Note: a "0H" is always
 57   ;                  returned for invalid data in the register used for
 58   ;                  the look-up.
```

```
59  ; PRE-REQUISITES: 1-COLD_START_INITIALIZATION in the Main Executive Program
60  ;                    must initialize the following: PASS_CNTR, INTGRTN_CNTR,
61  ;                    KEY_SERVICED1, and KEY_DECODED_NOT.
62  ;                 2-The routine PTSRK1 must have already been executed. This
63  ;                    routine sets the flag KEY_DEP1
64  ; INPUTS:
65  ;   -I/O; None
66  ;   -REGISTERS; TBL_INDEX_POINTER(R5,Bnk2-15H)
67  ;   -MAILBOXES; None
68  ;   -FLAGS; None
69  ;   -OTHER MODULES:
70  ;     -I/O; None
71  ;     -REGISTERS; None
72  ;     -MAILBOXES; None
73  ;     -FLAGS; None
74  ;   -OTHER SUBROUTINES:
75  ;     -I/O; None
76  ;     -REGISTERS; KEY_ROW_POINTER(R1,Bnk2-11H)-PTSRK1, INTGRTN_CNTR(R2,Bnk2-
77  ;                 12H)-PTSRK1, KEY_COL_DATA(R4,Bnk2-14H)
78  ;     -MAILBOXES; None
79  ;     -FLAGS; KEY_DEP1(BH.7-F7H)-PTSRK1, KEY_SERVICED1(BH.2-F2H)-PTSRK1
80  ; OUTPUTS:
81  ;   -I/O; None
82  ;   -REGISTERS; TBL_INDEX_POINTER(R5,Bnk2-15H)
83  ;   -MAILBOXES; None
84  ;   -FLAGS; KEY_DECODED_NOT(20H.0)
85  ;   -OTHER MODULES:
86  ;     -I/O; None
87  ;     -REGISTERS; None
88  ;     -MAILBOXES; None
89  ;     -FLAGS; None
90  ;   -OTHER SUBROUTINES:
91  ;     -I/O; None
92  ;     -REGISTERS;INTGRTN_CNTR(R2,Bnk2-12H)-PTSRK1,PASS_CNTR(R3,Bnk2-13H)-PTSRK1
93  ;     -MAILBOXES; ACCumulator
94  ;     -FLAGS; KEY_DEP1(BH.7-F7H)-PTSRK1, KEY_SERVICED1(BH.2-F2H)-PTSRK1
95  ; REGISTERS USED: ACC,R5, R4, R3, R2, R1 (All Registers use Bank 2)
96  ; MAXIMUM STACK DEPTH: 0
97  ; OUTSIDE SUBROUTINES CALLED: None
98  ; BRANCHING: None
99  ; EXTERNAL LABELS: KEY_DEP1, DCDKPD1, KEY_SERVICED1, KEY_DECODED_NOT
100 ; TEST CRITERIA: Test all functional aspects of this module with the EMV51
101 ;                Emulation Vehicle
102 ; INTERMODULE COMMUNICATION: None
103 ; ERROR EXITS:
104 ;   TYPE; Register Test - KEY_ROW_POINTER must be in the range of 0 to 8
105 ;   PROCEDURE; If out of range, a byte is set(PASS_CNTR) to another out
106 ;              of range value, and in the PTSRK1 routine all pertinent
107 ;              parameters are reset to initial values. This routine then
108 ;              ends with a RETURN.
109 ;
110 ; MODULE LENGTH: __63H __99Dec BYTES
111 ; MODULE EXECUTION TIME:
112 ;     CRYSTAL FREQ. ____12.00____MHZ
113 ;     MINIMUM TIME; ____8.00____USEC
114 ;     TYPICAL TIME; ____8.00____USEC
115 ;     MAXIMUM TIME; ____38.00____USEC
```

```
116  ;
117  ;       MIN EXECUTION CYCLES;  __8H ____8Dec
118  ;       TYP EXECUTION CYCLES;  __8H ____8Dec
119  ;       MAX EXECUTION CYCLES;  _26H ___38Dec
120  ;
121  ;************************************************************
122 +1  $EJ
123     NAME DECODE_KEYPAD1
124     D_K1 SEGMENT CODE
125     RSEG D_K1
126     EXTRN BIT (KEY_DEP1)
127     PUBLIC DCDKPD1,KEY_SERVICED1,KEY_DECODED_NOT
128     USING 2
129  ;************************************************************
130  ;              8051 SUBSET DATA MEMORY MAP
131  ;============================================================
132  ;                              BYTE
133  ;     NAME                     ADDRESS          MODULE(S) WHERE USED
134  ;------------------------------------------------------------
```

|      |     |                      |                 |                          |
|------|-----|----------------------|-----------------|--------------------------|
| REG  | 135 | TBL_INDEX_POINTER    | SET R5          | ;Bank 2                  |
| REG  | 136 | KEY_COL_DATA         | SET R4          | ;Bank 2                  |
| REG  | 137 | PASS_CNTR            | SET R3          | ;Bank 2                  |
| REG  | 138 | INTGRTN_CNTR         | SET R2          | ;Bank 2, Register 12H    |
| REG  | 139 | KEY_ROW_POINTER      | SET R1          | ;Bank 2                  |

```
140  ;************************************************************
141  ;         8051 SUBSET DATA MEMORY MAP - CONT'D
142  ;============================================================
143  ;                              BIT
144  ;     NAME                     ADDRESS          MODULE(S) WHERE USED
145  ;------------------------------------------------------------
```

|       |     |                   |              |       |
|-------|-----|-------------------|--------------|-------|
| 00F2  | 146 | KEY_SERVICED1     | BIT B.2      | ;F2H  |
| 0000  | 147 | KEY_DECODED_NOT   | BIT 20H.0    |       |

```
148  ;************************************************************
149 +1  $EJ
150     DCDKPD1:
```

| 0000 D2D4   | 151 |     SETB RS1                      | ;Be sure Bank Switch is set to "2"                |
|-------------|-----|-----------------------------------|---------------------------------------------------|
| 0002 C2D3   | 152 |     CLR RS0                       |                                                   |
| 0004 3022A F| 153 |     JNB KEY_DEP1,NO_KEY           | ;If key depressed fall thru!                      |
| 0007 C200 F | 154 |     CLR KEY_DEP1                  | ;Set Flag KEY_DEP1=0                              |
| 0009 0A     | 155 |     INC INTGRTN_CNTR              | ;Add 1 to INTGRTN_CNTR                            |
| 000A 20F224 | 156 |     JB KEY_SERVICED1,NO_KEY       |                                                   |
| 000D 8A1400 | 157 |     CJNE INTGRTN_CNTR,#20D,$+3    | ;Set-up for next instruction                      |
| 0010 5001   | 158 |     JNC $+3                       | ;If INTGRTN_CNTR is (20 (80 msec), return         |
| 0012 22     | 159 |     RET                           |                                                   |

```
160  ;------------------------------------------------------------
161     DECODE_KEY:
```

| 0013 7A05   | 162 |     MOV INTGRTN_CNTR,#05D         | ;This guarantees that the key will only be        |
|             | 163 |                                   | ; serviced one time, even if continuously         |
|             | 164 |                                   | ; depressed.                                      |
| 0015 B90900 | 165 |     CJNE KEY_ROW_POINTER,#09H,$+3 | ;Verify 0(R1(9H: If R1)9H, C=0                    |
| 0018 5020   | 166 |     JNC RESET1                    | ;If R1)9, Jump to Reset1                          |
| 001A E9     | 167 |     MOV A,KEY_ROW_POINTER         | ;ACC=pointer which is proportional to the row     |
|             | 168 |                                   | ; activated.                                      |
| 001B C3     | 169 |     CLR C                         | ;Prepare for the next RRC                         |
| 001C 13     | 170 |     RRC A                         | ;Divide ACC by 2                                  |
| 001D FD     | 171 |     MOV TBL_INDEX_POINTER,A       | ;Temp Store actual Row # in TBL_INDEX_POINTER     |
| 001E C4     | 172 |     SWAP A                        | ;Multiply by 16                                   |

```
001F 03              173                RR A                      ;Divide by 2-net is X8
0020 2D              174                ADD A,TBL_INDEX_POINTER   ;Total Multiply now =9 in ACC
0021 FD              175                MOV TBL_INDEX_POINTER,A   ;Temp Store Row times 9 in TBL_INDEX_POINTER
0022 EC              176                MOV A,KEY_COL_DATA        ;Load key data from register 4
0023 F4              177                CPL A                     ;K_C_D from the "A" chip is normally inverted
                     178                                          ; and occupies the high nibble of the byte
0024 C4              179                SWAP A
0025 540F            180                ANL A,#0FH                ;Mask off high nibble
0027 2D              181                ADD A,TBL_INDEX_POINTER   ;ACC=(9 x Row)+Key position [1 to 4]
0028 900000    F     182                MOV DPTR,#TABLE_DECODE1
002B 93              183                MOVC A,@A+DPTR            ;Get key value (1 to F) from table
002C D2F2            184                SETB KEY_SERVICED1        ;Set flag - passed 1 time
002E C200            185                CLR KEY_DECODED_NOT       ;NH, L=Key decoded
0030 22              186                RET
                     187            ;-----------------------------
                     188            NO_KEY:
0031 DA06            189                DJNZ INTGRTN_CNTR,RTRN    ;If CNTR )0, then Return
0033 7A01            190                MOV INTGRTN_CNTR,#1H      ;Set CNTR =1
0035 D200            191                SETB KEY_DECODED_NOT      ;NH, L=Key decoded
0037 C2F2            192                CLR KEY_SERVICED1
0039 22              193            RTRN: RET
                     194            ;-----------------------------
                     195            RESET1:
003A 7B7F            196                MOV PASS_CNTR,#7FH        ;Force a Reset of parameters on next pass
003C D220            197                SETB KEY_DECODED_NOT      ;NH, L=Key decoded
003E 22              198                RET
                     199            ;=============================
                     200            TABLE_DECODE1:                ;Table is backward-value is calculated
003F 00              201                DB 00H                    ;4th Row - no key
0040 0E              202                DB 0EH                    ;1st Key-E for * Key
0041 00              203                DB 00H                    ;2nd Key-0 for OPER Key
0042 00              204                DB 00H                    ;No value
0043 0F              205                DB 0FH                    ;3rd Key-F for # Key
0044 00              206                DB 0,0,0                  ;No Value
0045 00
0046 00
0047 04              207                DB 04H                    ;4th Key-4
                     208            TABLE_ROW_3:
0048 00              209                DB 00H                    ;No Key
0049 07              210                DB 07H                    ;1st Key-7
004A 08              211                DB 08H                    ;2nd Key-8
004B 00              212                DB 00H                    ;No value
004C 09              213                DB 09H                    ;3rd Key-9
004D 00              214                DB 0,0,0                  ;No Value
004E 00
004F 00
0050 03              215                DB 03H                    ;4th Key-3
                     216            TABLE_ROW_2:
0051 00              217                DB 00H                    ;No Key
0052 04              218                DB 04H                    ;1st Key-4
0053 05              219                DB 05H                    ;2nd Key-5
0054 00              220                DB 00H                    ;No value
0055 06              221                DB 06H                    ;3rd Key-6
0056 00              222                DB 0,0,0                  ;No Value
0057 00
0058 00
0059 02              223                DB 02H                    ;4th Key-2
```

```
                    224     TABLE_ROW_1:
005A 00             225             DB 00H              ;No Key
005B 01             226             DB 01H              ;1st Key-1
005C 02             227             DB 02H              ;2nd Key-2
005D 00             228             DB 00H              ;No value
005E 03             229             DB 03H              ;3rd Key-3
005F 00             230             DB 0,0,0            ;No Value
0060 00
0061 00
0062 01             231             DB 01H              ;4th Key-1
                    232     END
```

XREF SYMBOL TABLE LISTING
———— —————— ———— ————————

| NAME            | TYPE   | VALUE      | ATTRIBUTES AND REFERENCES      |
|-----------------|--------|------------|--------------------------------|
| B . . . . . . . | D ADDR | 00F0H   A  | 146                            |
| D_K1. . . . . . | C SEG  | 0063H      | REL=UNIT  124# 125             |
| DCDKPD1 . . . . | C ADDR | 0000H   R PUB | SEG=D_K1  127 150#          |
| DECODE_KEY. . . | C ADDR | 0013H   R  | SEG=D_K1  161#                 |
| DECODE_KEYPAD1. | ————   | ————       | 123                            |
| INTGRTN_CNTR. . | REG    | R2         | 138# 155 157 162 189 190       |
| KEY_COL_DATA. . | REG    | R4         | 136# 176                       |
| KEY_DECODED_NOT | B ADDR | 0020H.0 A PUB | 127 147# 185 191 197        |
| KEY_DEP1. . . . | B ADDR | ————    EXT | 126# 153 154                 |
| KEY_ROW_POINTER | REG    | R1         | 139# 165 167                   |
| KEY_SERVICED1 . | B ADDR | 00F0H.2 A PUB | 127 146# 156 184 192        |
| NO_KEY. . . . . | C ADDR | 0031H   R  | SEG=D_K1  153 156 188#         |
| PASS_CNTR . . . | REG    | R3         | 137# 196                       |
| RESET1. . . . . | C ADDR | 003AH   R  | SEG=D_K1  166 195#             |
| RS0 . . . . . . | B ADDR | 00D0H.3 A  | 152                            |
| RS1 . . . . . . | B ADDR | 00D0H.4 A  | 151                            |
| RTRN. . . . . . | C ADDR | 0039H   R  | SEG=D_K1  189 193#             |
| TABLE_DECODE1 . | C ADDR | 003FH   R  | SEG=D_K1  182 200#             |
| TABLE_ROW_1 . . | C ADDR | 005AH   R  | SEG=D_K1  224#                 |
| TABLE_ROW_2 . . | C ADDR | 0051H   R  | SEG=D_K1  216#                 |
| TABLE_ROW_3 . . | C ADDR | 0048H   R  | SEG=D_K1  208#                 |
| TEL_INDEX_POINTER | REG  | R5         | 135# 171 174 175 181           |

REGISTER BANK(S) USED: 0 2, TARGET MACHINE(S): 8051

ASSEMBLY COMPLETE, NO ERRORS FOUND

I claim:

1. A multiplex system comprising:
   a master controller which comprises means for generating a series of clock pulses on a clock terminal, means for monitoring data on a data terminal, and means for supplying a DC voltage across first and second power terminals;
   a plurality of remote stations, each adapted to receive power from the power terminals, to receive clock pulses from the clock terminal, and to send data to the data terminal; and
   a cable interconnecting the master controller and at least one of the remote terminals, said cable comprising:
      a clock conductor connected to the clock terminal;
      a data conductor connected to the data terminal;
      first and second power conductors connected to the first and second power terminals, respectively;
      means for capacitively coupling the power conductors together; and
      means for grounding a selected one of the power conductors;
      said power conductors disposed substantially around the clock and data conductors to substantially reduce RF interference generated by the clock and data conductors.

2. The invention of claim 1 wherein one of the power conductors is disposed co-axially around the clock conductor and the other of the power conductors is disposed co-axially round the data conductor.

3. The invention of claim 2 wherein the power conductors are secured together in side-by-side relationship and are electrically insulated from one another by an insulating body.

4. The invention of claim 1 wherein the clock and data conductors are disposed adjacent and parallel to one another; and wherein the power conductors are each disposed on a respective side of the clock and data conductors such that each of the power conductors shields the respective side of the clock and data conductors.

5. The invention of claim 1 wherein the means for capacitively coupling the power conductors together comprises:
   a plurality of capacitors interconnected between the power conductors, wherein the separation between each adjacent pair of the capacitors is no greater than 20 feet.

6. The invention of claim 1 wherein the means for capacitively coupling the power conductors together comprises:
   a plurality of capacitors interconnected between the power conductors, at least some of the capacitors included in the remote stations.

7. A multiplex system comprising:
   a master controller which comprises means for generating a series of clock pulses on a clock terminal, means for monitoring a series of data pulses on a data terminal, means for applying a DC power voltage to a first power terminal, and means for grounding a second power terminal;
   a twin coaxial cable coupled to the master controller, said cable comprising first and second inner conductors, each connected to a respective one of the clock and data terminals, and first and second outer conductors, each connected to a respective one of the power terminals, said first and second outer conductors disposed coaxially around and insulated from the first and second inner conductors, respectively, such that the outer conductors shield the inner conductors; and
   a plurality of remote stations connected to the cable and spaced along the cable, each remote station comprising first means, coupled to the inner conductors, for receiving the clock pulses and for generating at least some of the data pulses, and second means, coupled to the outer conductors, for supplying power to the first means; and
   means, included in at least a plurality of the remote stations, for capacitively coupling the outer conductors together.

8. The invention of claim 7 wherein the capacitively coupling means comprises a plurality of capacitors, each included in a respective one of the remote stations, each interconnected between the outer conductors.

9. The invention of claim 7 wherein the cable further comprises an insulating body disposed around the outer conductors to secure the outer conductors together in side-by-side relationship.

10. The invention of claim 9 wherein the insulating body defines an external key positioned to identify a selected polarity of the cable.

11. The invention of claim 8 wherein the separation between each adjacent pair of the capacitors is no greater than 20 feet.

* * * * *